United States Patent [19]
Saito et al.

[11] Patent Number: 5,676,765
[45] Date of Patent: Oct. 14, 1997

[54] PIN JUNCTION PHOTOVOLTAIC DEVICE HAVING A MULTI-LAYERED I-TYPE SEMICONDUCTOR LAYER WITH A SPECIFIC NON-SINGLE CRYSTAL I-TYPE LAYER FORMED BY A MICROWAVE PLASMA CVD PROCESS

[75] Inventors: Keishi Saito; Koichi Matsuda, both of Nara; Hiroshi Shimoda; Yusuke Miyamoto, both of Tsuzuki-gun, all of Japan

[73] Assignee: Canon Kabushiki Kaisha, Tokyo, Japan

[21] Appl. No.: 411,225

[22] Filed: Mar. 27, 1995

[30] Foreign Application Priority Data

Mar. 25, 1994 [JP] Japan .................. 6-055730

[51] Int. Cl.[6] .................................. H01L 31/075
[52] U.S. Cl. ................. 136/258; 136/249; 257/53; 257/55; 257/56; 257/458
[58] Field of Search .............. 136/258 AM, 249 TJ; 257/53, 55–56, 458

[56] References Cited

U.S. PATENT DOCUMENTS

| 4,196,438 | 4/1980 | Carlson ............... | 257/54 |
| 5,034,333 | 7/1991 | Kim .................... | 437/4 |
| 5,256,576 | 10/1993 | Guha et al. ........... | 437/4 |

FOREIGN PATENT DOCUMENTS 2-117127  5/1990  Japan ............... 136/258 AM

OTHER PUBLICATIONS

T. Yokoi, et al. "Fabrication of Stable Hydrogenated Amorphous Silicon from $SiH_2Cl_2$ by ECR–Hydrogen–Plasma," Technical Digest of the International PVSEC-7, Nagoya, Japan, 1993, pp. 295–296.

D.L. Staebler, et al., "Reversible conductivity changes in discharge —produced amorphous Si", Applied Physics Letters, vol. 31, 1977, pp. 292–294.

S. Muramatsu, et al., "Medium–Range Order of Amorphous Silicon Germanium Alloys: Small–Angle X–Ray Scattering Study", Jap. J. Appl. Phys., vol. 28, pp. L1092–L1095 (1989).

M. Vanacek, et al., "Direct Measurement of the Gap States and Band Tail Absorption by Constant Photocurrent Method in Amophous Silicon", Solid State Communications, vol. 39, 1981, pp. 1199–1202.

*Primary Examiner*—Aaron Weisstuch
*Attorney, Agent, or Firm*—Fitzpatrick, Cella, Harper & Scinto

[57] ABSTRACT

A photovoltaic element comprising a substrate and a multi-layered semiconductor active layer having a pin junction structure disposed on said substrate, said multi-layered semiconductor layer comprising a non-single crystal semiconductor layer of n- or p-type, a non-single crystal i-type semiconductor layer and a non-single crystal semiconductor layer of p- or n-type being stacked in this order from the substrate side, characterized in that said i-type semiconductor layer comprises a three-layered structure comprising a non-single crystal layer (b) formed by means of a microwave plasma CVD process interposed between a pair of non-single crystal layers (a) and (c) each formed by means of a RF plasma CVD process, and said i-type layer (b) is a non-single crystal i-type layer formed by means of the microwave plasma process from a mixture of a silane series gas not containing chlorine atom(s), a chlorine-containing raw material gas in an amount of 10% or less of the total amount of the chlorine-free silane series gas and the chlorine-containing raw material gas, and hydrogen gas.

16 Claims, 10 Drawing Sheets

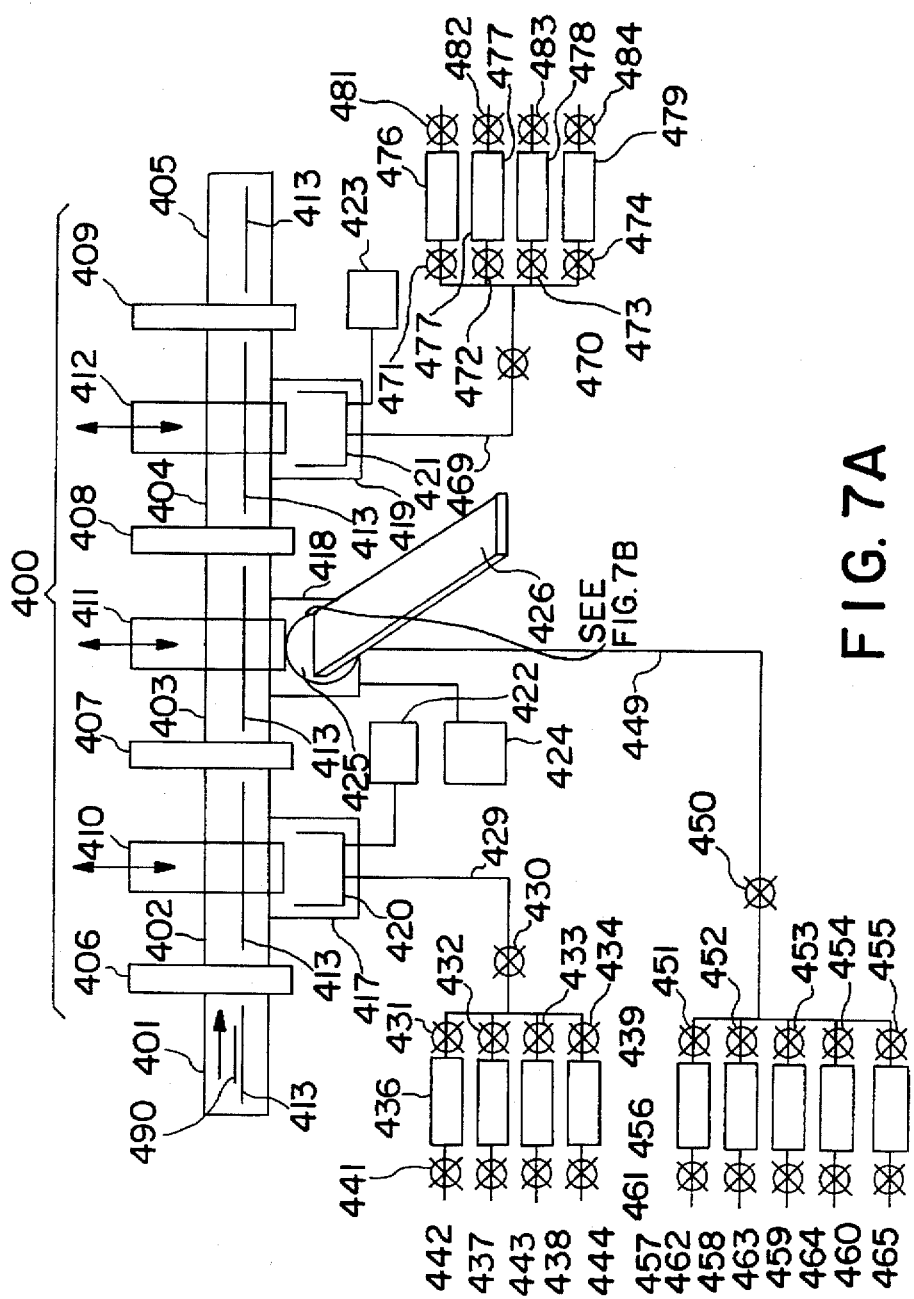
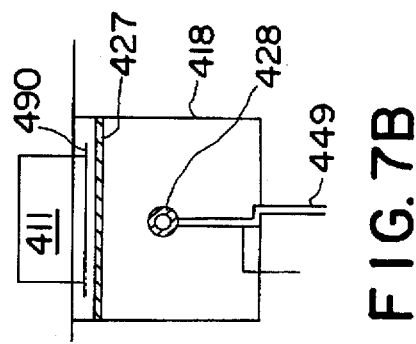
FIG. 7B
FIG. 7A

PIN JUNCTION PHOTOVOLTAIC DEVICE HAVING A MULTI-LAYERED I-TYPE SEMICONDUCTOR LAYER WITH A SPECIFIC NON-SINGLE CRYSTAL I-TYPE LAYER FORMED BY A MICROWAVE PLASMA CVD PROCESS

BACKGROUND OF THE INVENTION

1. Field of the Invention

The present invention relates to an improvement in a photovoltaic device such as a solar cell, photosensor or the like in which a non-single crystal semiconductor comprised of an amorphous silicon material (including a microcrystalline silicon material), an amorphous silicon-germanium material, or a polycrystalline silicon material is used. More particularly, the present invention concerns an improved pin junction photovoltaic device having an i-type semiconductor layer having a three-layered structure comprising a specific non-single crystal i-type layer formed by a microwave plasma CVD process (hereinafter referred to as MW plasma CVD process) which is interposed between a pair of non-single crystal i-type layers each formed by a high frequency plasma CVD process (hereinafter referred to as RF plasma CVD process). The photovoltaic device stably and continuously exhibits a desirable photoelectric conversion efficiency without being deteriorated even in the case where it is continuously subjected to irradiation of light under severe environmental conditions over a long period of time and it excels in environmental resistance.

2. Related Background Art

D. L. Staebler and C. R. Wronski reported that an amorphous Si material produced by glow discharge of $SiH_4$ was degraded when it was exposed to light over a long period of time (see, Applied Physics Letters, vol. 31, No. 4, pp. 292–294, 15 Aug. 1977). Since then, the problem of occurrence of said light degradation is still the most serious subject to be solved in the field of amorphous silicon semiconductors.

In order to solve such light degradation which occurred in an amorphous silicon semiconductor, U.S. Pat. No. 4,196,438 (hereinafter referred to as Document 1) discloses a process for decreasing dangling bonds of the silicon atoms in the amorphous silicon semiconductor by adding chlorine atoms. However, as a result of experimental studies by the present inventors wherein a plurality of photovoltaic devices using amorphous silicon semiconductors containing chlorine atoms formed in accordance with the method described in Document 1 and subjected to irradiation of AM 1.5 light as pseudo sunlight over a long period of time to examine their characteristics at the initial stage and after the light irradiation, it was found that none of the photovoltaic devices exhibits satisfactory initial characteristics including open circuit voltage and fill-factor and it does not provide any distinguishable improvement in the light degradation in terms of the photoelectric conversion efficiency. Hence, the method proposed by Document 1 is not effective in practice in solving the problem of light degradation in an amorphous silicon photovoltaic device.

Besides the above, T. Yokoi et al. reported that a hydrogenated amorphous silicon film (that is, an a-Si: H film) formed from $SiH_2Cl_2$ as a raw material gas with ECR-Hydrogen-Plasma has only slight light degradation (see, T. Yokoi, M. Azuma and I. Shimizu, *Technical Digest of the International PVSEC-7*, Nagoya, Japan, 1993, p.295) (this document will be hereinafter referred to as Document 2). Particularly, in Document 2, there is prepared a small specimen comprising an about 1 um thick hydrogenated amorphous silicon film formed on a small area substrate, and the resultant specimen is evaluated with respect to its photoconductivity by observing the mobility of electrons in the crosswise direction. However, Document 2 describes nothing concerning whether or not said hydrogenated amorphous silicon film obtained from $SiH_2Cl_2$ with ECR-Hydrogen-Plasma is effective in obtaining a large area pin junction photovoltaic element, specifically, a solar cell having a large area, which is hardly deteriorated under continuous light irradiation under severe environmental conditions over a long period of time. Further, the ECR-hydrogen-plasma process is effective only in obtaining a small area semiconductor device but is not applicable in obtaining a large area semiconductor device such as a solar cell, which is usually produced by the RF plasma CVD process or MW plasma CVD process.

SUMMARY OF THE INVENTION

The present invention is aimed at providing an improved, non-single crystal photovoltaic device which is hardly deteriorated in terms of photovoltaic characteristics even when it is continuously used under severe environmental conditions of high temperature and high humidity over a long period of time while being exposed to irradiation of light.

Another object of the present invention is to provide a pin junction non-single crystal photovoltaic device having an improved i-type semiconductor layer with a stacked structure comprising a plurality of substantially intrinsic layers, which is hardly deteriorated in terms of photovoltaic characteristics even when it is continuously used under severe environmental conditions of high temperature and high humidity over a long period of time while being exposed to irradiation of light.

A further object of the present invention is to provide a pin junction non-single crystal photovoltaic device having an improved i-type semiconductor layer with a stacked structure comprising a plurality of substantially intrinsic layers, which excels in I-V characteristics (current-voltage characteristics) and stably and continuously exhibits a desirable photoelectric conversion efficiency without being deteriorated over a long period of time.

A further object of the present invention is to provide a pin junction non-single crystal photovoltaic device having an improved i-type semiconductor layer with a stacked structure comprising an i-type non-single crystal semiconductor layer (b) formed by a MW plasma CVD process (this i-type semiconductor layer (b) will be hereinafter referred to as MW-i-type layer) interposed between a pair of i-type non-single crystal semiconductor layers (a) and (c) each formed by a RF plasma CVD process (these i-type semiconductor layers (a) and (c) will be hereinafter referred to as RF-i-type layers), which is hardly deteriorated in terms of photovoltaic characteristics even when it is continuously used under severe environmental conditions of high temperature and high humidity over a long period of time while being exposed to irradiation of light.

A further object of the present invention is to provide a pin junction non-single crystal photovoltaic device having an improved i-type semiconductor layer with a stacked structure comprising a MW-i-type layer interposed between a pair of RF-i-type layers, which excels not only in I-V characteristics (current-voltage characteristics) but also in initial photoelectric conversion efficiency and stably and continuously exhibits a desirable photoelectric conversion efficiency without being deteriorated over a long period of time.

A further object of the present invention is to provide a pin junction non-single crystal photovoltaic device having an improved i-type semiconductor layer with a stacked structure comprising a MW-i-type non-single crystal layer formed from a mixture of a silane series raw material gas not containing any chlorine atom(s) (hereinafter referred to as chlorine-free silane series raw material gas), a chlorine-containing raw material gas in an amount of 10% or less of the total amount of the chlorine-free silane series raw material gas and the chlorine-containing raw material gas, and hydrogen gas, interposed between a pair of RF-i-type non-single crystal layers, which is hardly deteriorated in terms of I–V characteristics even when it is continuously used under severe environmental conditions of high temperature and high humidity over a long period of time while being exposed to irradiation of light.

A further object of the present invention is to provide a pin junction non-single crystal photovoltaic device having an improved i-type semiconductor layer with a stacked structure comprising a MW-i-type non-single crystal layer formed from a mixture of a chlorine-free silane series raw material gas, a chlorine-containing raw material gas in an amount of 10% or less of the total amount of the chlorine-free silane series raw material gas and the chlorine-containing raw material gas, and hydrogen gas, interposed between a pair of RF-i-type non-single crystal layers, which excels in initial photoelectric conversion efficiency and which stably and continuously exhibits a desirable photoelectric conversion efficiency without being deteriorated over a long period of time.

A typical embodiment of a photovoltaic device according to the present invention comprises a substrate having an electroconductive electrode thereon and a stacked structure with a pin junction disposed on said substrate, said stacked structure comprising (a) a non-single crystal semiconductor layer of n- or p-type, (b) a non-single crystal semiconductor layer of i-type disposed on said n- or p-type layer (a), and (c) a non-single crystal semiconductor layer of p- or n-type disposed on said i-type layer (b), characterized in that said i-type semiconductor layer comprises a three-layered structure comprising a MW-i-type non-single crystal layer formed from a mixture of a chlorine-free silane series raw material gas, a chlorine containing raw material gas in an amount of 10% or less of the total amount of the chlorine-free silane series raw material gas and the chlorine-containing raw material gas, and hydrogen gas by the MW plasma CVD process, interposed between a pair of RF-i-type non-single crystal layers each formed by the RF plasma CVD process without using any chlorine-containing raw material gas. The photovoltaic device thus constituted is hardly degraded even upon continuous exposure to light over a long period of time, wherein the photovoltaic device always and stably provides excellent photovoltaic characteristics.

BRIEF DESCRIPTION OF THE DRAWINGS

FIG. 7A is a schematic diagram of an isolated multi-chambered film-forming apparatus suitable for the preparation of a photovoltaic device according to the present invention.

FIG. 7B is an expanded view of a deposition chamber within the multi-chambered film-forming apparatus.

DESCRIPTION OF THE INVENTION AND THE PREFERRED EMBODIMENTS

Figure 1:
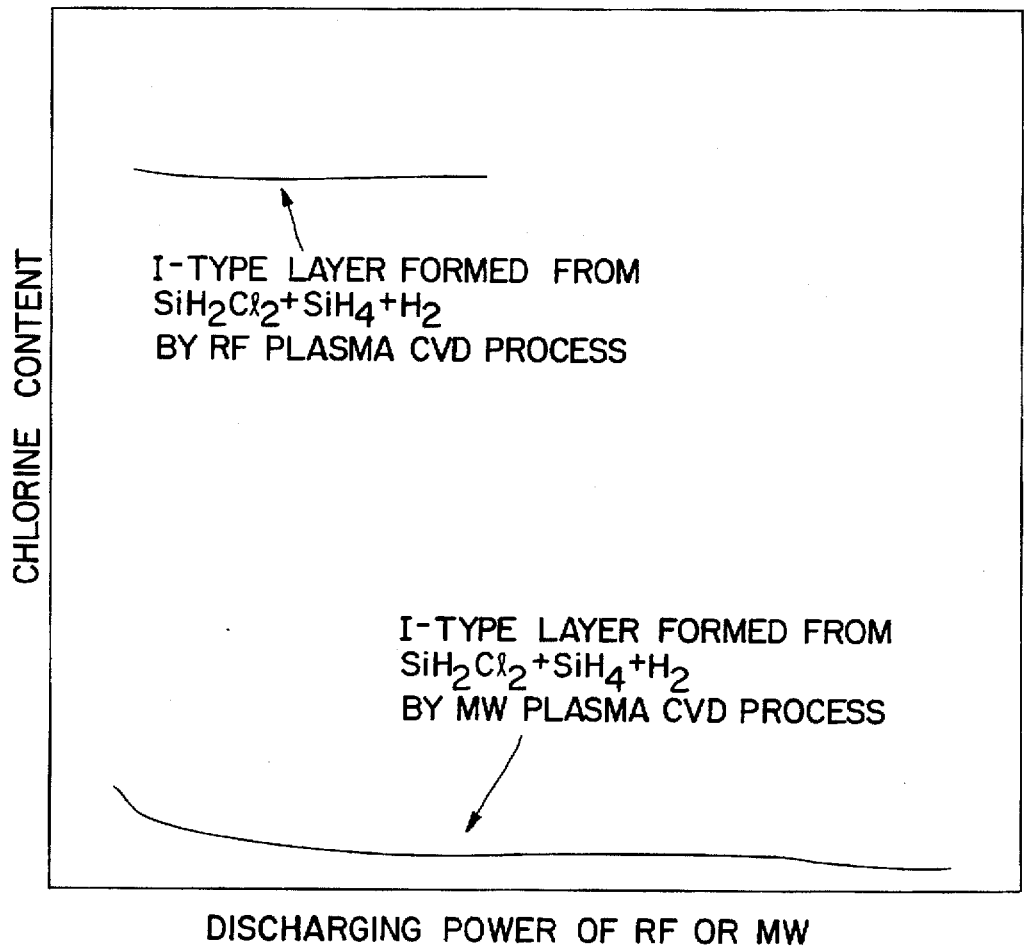
FIG. 1 is a graph including a curve of experimental results of i-type films formed by the RF plasma CVD process with respect to the interrelation between the chlorine content and the applied discharging power and another curve of experimental results of i-type films formed by the MW plasma CVD process with respect to the interrelation between the chlorine content and the applied discharging power.

In order to solve the problems relating to light degradation in the conventional semiconductor device and in order to attain the above objects, the present inventors conducted experimental studies. As a result, the present inventors determined that a pin junction non-single crystal photovoltaic device having an i-type semiconductor layer with a stacked structure comprising (b) a MW-i-type layer formed from a mixture composed of a silicon-containing raw material gas with no chlorine, a chlorine-containing raw material gas in a limited amount, and hydrogen gas by a MW plasma CVD process, interposed between two RF-i-type layers (a) and (c) each formed from an appropriate silicon-containing raw material gas by a RF plasma CVD process without using any chlorine-containing raw material gas surpasses the conventional pin junction non-single crystal photovoltaic device in terms of light degradation. The present invention has been accomplished based on this finding.

In the following, experimental studies conducted by the present inventors will be described.

It is known that in order to improve the characteristics of an i-type silicon-containing non-single crystal semiconductor layer of a photovoltaic device, halogen atoms are incorporated in the i-type semiconductor layer to compensate dangling bonds of the silicon atoms therein, thereby preventing occurrence of defects in the i-type semiconductor layer. As the halogen atom, fluorine (F) is usually used in view of the magnitude of its bond energy, electronegativity, and atomic radius. It is uncommon to use chlorine (Cl), bromine (Br), or iodine (I). Considering this technical background, the present inventors conducted the following experiments.

Experiment 1

There were prepared a plurality of test samples A by providing a plurality of substrates and forming an i-type layer on each substrate by means of the RF plasma CVD process using a mixture of a fluorine-containing raw material gas, a silicon-containing raw material gas, and hydrogen gas, wherein the applied high frequency power (that is, a RF power) was varied in each case.

Separately, there were prepared a plurality of test samples B by providing a plurality of substrates and forming an i-type layer on each substrate by means of the MW plasma CVD process using a mixture of a fluorine-containing raw material gas, a silicon-containing raw material gas, and hydrogen gas, wherein the applied microwave power (that is, a MW power) was varied in each case.

As for each of the resultant test samples A and B, each test sample was subjected to measurement by SIMS. As a result, all of the test samples A and B were found to contain fluorine atoms in a significant amount. As the reason for this, it is considered that the fluorine atoms were mostly incorporated into the deposited film and remained therein without being removed, possibly due to a large Si-F bond energy.

Experiment 2

There were prepared a plurality of test samples C by providing a plurality of substrates and forming an i-type layer on each substrate by means of the RF plasma CVD process using a mixture of a chlorine-containing raw material gas, a silicon-containing raw material gas, and hydrogen gas, wherein the applied high frequency power (that is, a RF power) was varied in each case.

Separately, there were prepared a plurality of test samples D by providing a plurality of substrates and forming an i-type layer on each substrate by means of the MW plasma CVD process using a mixture of a chlorine-containing raw material gas, a silicon-containing raw material gas, and hydrogen gas, wherein the applied microwave power (that is, a MW power) was varied in each case.

As for each of the resultant test samples C and D, examination of chlorine content distribution was conducted by subjecting each test sample to measurement by SIMS. The results obtained are graphically shown in FIG. 1.

From the results obtained, it was found that all of the i-type layers of the test samples C formed by the RF plasma CVD process contained a significant amount of chlorine atoms remained therein without having been extracted therefrom.

On the other hand, as for the i-type layers of the test sample D formed by the MW plasma CVD process, it was found that all of them contained only a slight amount of chlorine atoms. It is considered that almost all the chlorine atoms present during film formation did not remain in the layer.

Each of the test samples C and D was examined with respect to its density of states in accordance with the known CPM method (the constant photocurrent method) (see M. Vanecek et al, Solid State Communications, Vol. 39, 1981, pp. 1199–1202). In addition, each of the test samples C and D was examined with respect to its microvoid content in accordance with the known small-angle X-ray scattering method (see, *Japanese Journal of Applied Physics* Vol. 28, No. 7, pp. L1092–L1095, July 1989). The results obtained are graphically shown in FIG. 2.

Figure 2:
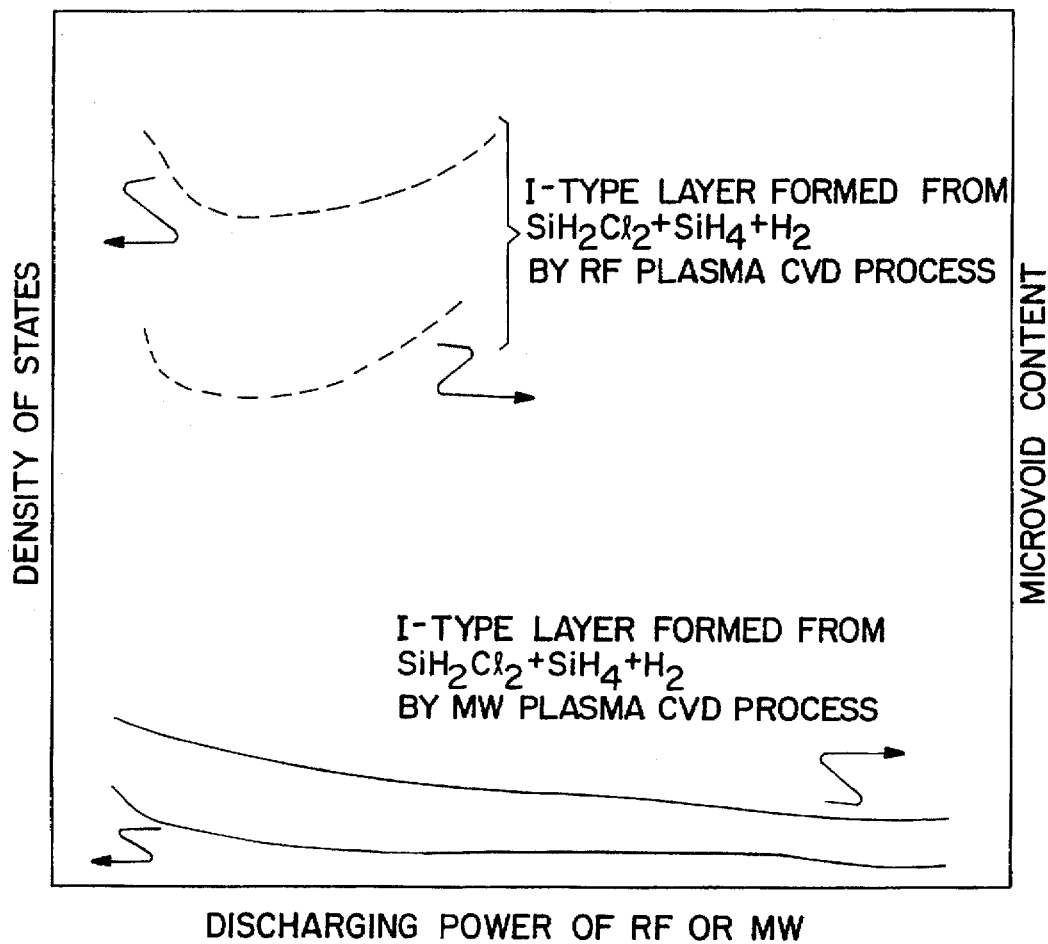
FIG. 2 is a graph showing interrelations among the density of states, microvoid content, and RF or MW discharging power employed for forming an i-type layer from $SiH_2Cl_2+SiH_4+H_2$ by the RF plasma CVD process and an i-type layer formed from $SiH_2Cl_2+SiH_4+H_2$ by the MW plasma CVD process.

From the results shown in FIG. 2, it is understood that the i-type layers of the test samples D formed by the MW plasma CVD process are lower in density of states and microvoid content than the i-type layers of the test samples formed by the RF plasma CVD process.

From the results shown in FIG. 2, it thus is understood that the i-type layers formed by the MW plasma CVD process are superior to the i-type layers formed by the RF plasma CVD process. However, from the results shown in FIG. 1, it is understood that the chlorine content distribution in the i-type layer formed by the MW plasma CVD process has a tendency of being increased in opposite interface regions.

Experiment 3

In view of the finding obtained in Experiment 2 that the chlorine content distribution in the i-type layer formed by the MW plasma CVD process has a tendency of being increased in opposite interface regions, there were prepared two different semiconductor samples A and B.

The semiconductor sample A comprised a stacked structure formed on a substrate, said stacked structure comprising an i-type layer interposed between an n-type layer and a p-type layer, and said i-type layer comprising an i-type layer (i) formed by the MW-plasma CVD process.

The semiconductor sample B comprised a stacked structure formed on a substrate, said stacked structure comprising an i-type layer interposed between an n-type layer and a p-type layer, and said i-type layer having a three-layered structure comprising an i-type layer b) formed by the MW-plasma CVD process interposed between a pair of i-type layers (a) and (c) each formed by the RF plasma CVD process.

The semiconductor sample A was prepared by forming by the RF plasma CVD process, on a substrate, an n-type layer from a mixture of a silicon-containing raw material gas containing no chlorine, hydrogen gas, and an n-type dopant-imparting raw material gas forming by the MW plasma CVD process, on said n-type layer, an i-type layer (i) (that is, a MW-i-type layer) from a mixture of a silicon-containing raw material gas, a chlorine-containing raw material gas, and hydrogen gas, and forming by the RF plasma CVD process, on said i-type layer (i), a p-type layer from a mixture of a silicon-containing raw material gas containing no chlorine, hydrogen gas, and a p-type dopant-imparting raw material gas.

The semiconductor sample B was prepared by forming by the RF plasma CVD process, on a substrate, an n-type layer from a mixture of a silicon-containing raw material gas containing no chlorine, hydrogen gas, and an n-type dopant-imparting raw material gas forming by the RF plasma CVD process, on said n-type layer, an i-type layer (a) (that is, a RF-i-type layer) from a mixture of a silicon-containing raw material gas containing no chlorine, and hydrogen gas, forming by the MW plasma CVD process, on said i-type layer (a), an i-type layer (b) (that is, a MW-i-type layer) from a mixture of a silicon-containing raw material gas, a chlorine-containing raw material gas, and hydrogen gas, forming by the RF plasma CVD process, on said i-type layer (b), an i-type layer (c) (that is, a RF-i-type layer) from a mixture of a silicon-containing raw material gas containing no chlorine and hydrogen gas, and forming by the RF plasma CVD process, on said i-type layer (c), a p-type layer from a mixture of a silicon-containing raw material gas, containing no chlorine, hydrogen gas, and a p-type dopant-imparting raw material gas.

Each of the resultant semiconductor samples A and B was examined with respect to its chlorine content distribution by means of SIMS.

Figure 3A:
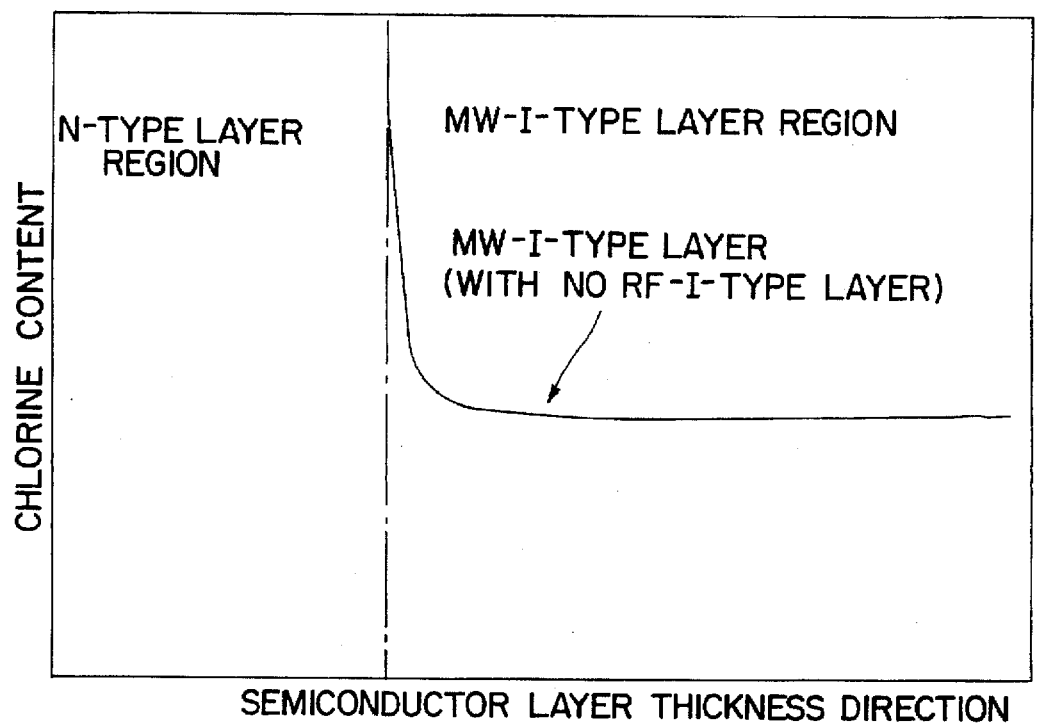
FIG. 3(A) is a schematic explanatory view of a stacked structure comprising a MW-i-type layer (formed from $SiH_2Cl_2+SiH_4+H_2$ by the MW plasma CVD process) between an n-type layer and a p-type layer (not shown), in which it is shown that the amount of chlorine atoms incorporated upon the formation of said MW-i-type layer is distributed in a partial layer region of the MW-i-type layer situated next to the n-type layer.
Figure 3B:
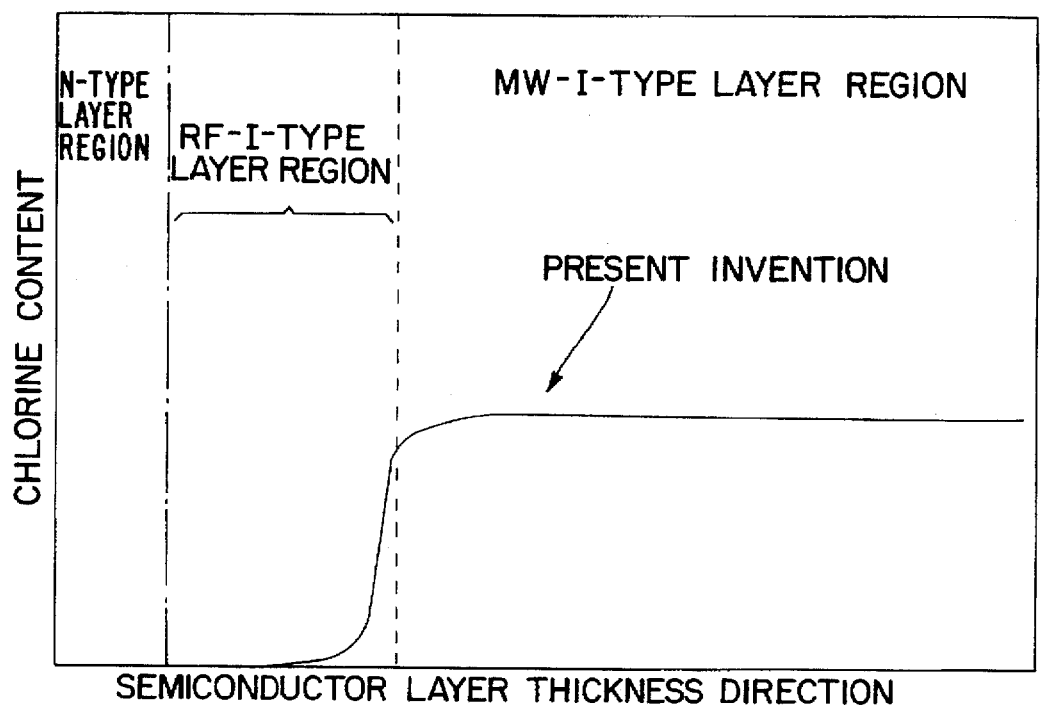
FIG. 3(B) is a schematic explanatory view of a stacked structure comprising a three-layered i-type layer interposed between an n-type layer and a p-type layer (not shown), said three-layered i-type layer comprising a MW-i-type layer (formed from $SiH_2Cl_2+SiH_4+H_2$ by the MW plasma CVD process) between a pair of RF-i-type layers (formed by the RF plasma CVD process without using any chlorine-containing raw material; of the two RF-i-type layers, the one positioned next to the p-type layer is not shown), in which it is shown that the amount of chlorine atoms incorporated upon the formation of said MW-i-type layer is distributed not only in a partial layer region of the MW-i type layer but also in a partial layer region of the RF-i-type layer situated next to the n-type layer.
Figure 3C:
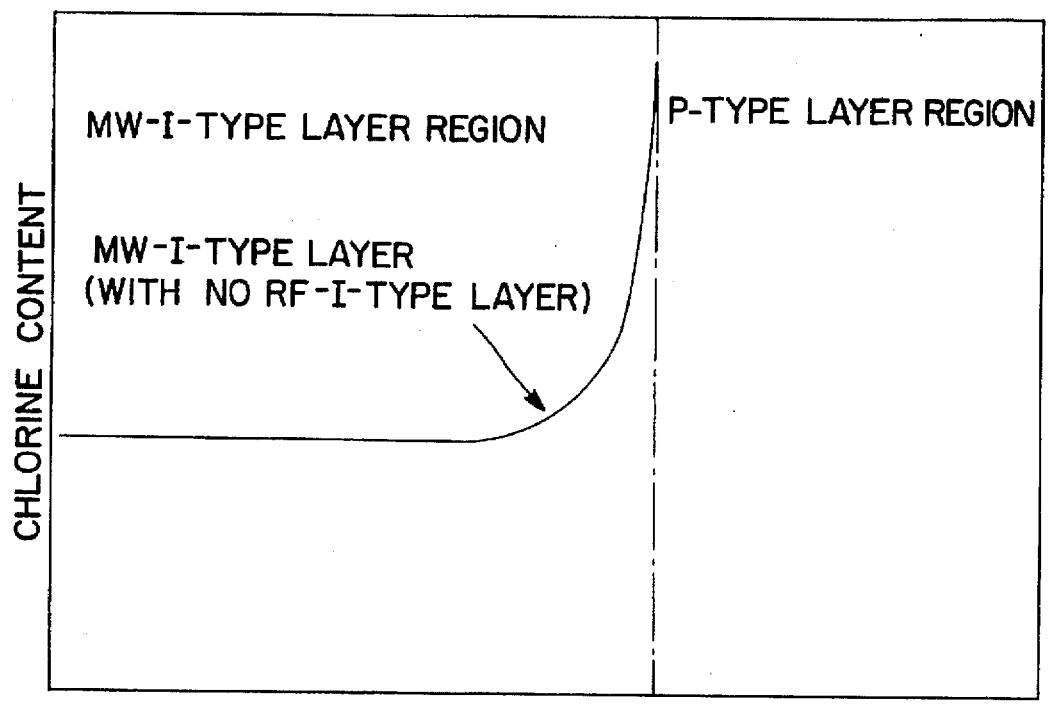
FIG. 3(C) is a schematic explanatory view of a stacked structure comprising a MW-i-type layer (formed from $SiH_2Cl_2+SiH_4+H_2$ by the MW plasma CVD process) between an n-type layer (not shown) and a p-type layer, in which it is shown that the amount of chlorine atoms incorporated upon the formation of said MW-i-type layer is distributed in a partial layer region of the MW-i-type layer situated next to the p-type layer.

The results obtained for the semiconductor sample A are graphically shown in FIGS. 3(A) and 3(C).

Figure 3D:
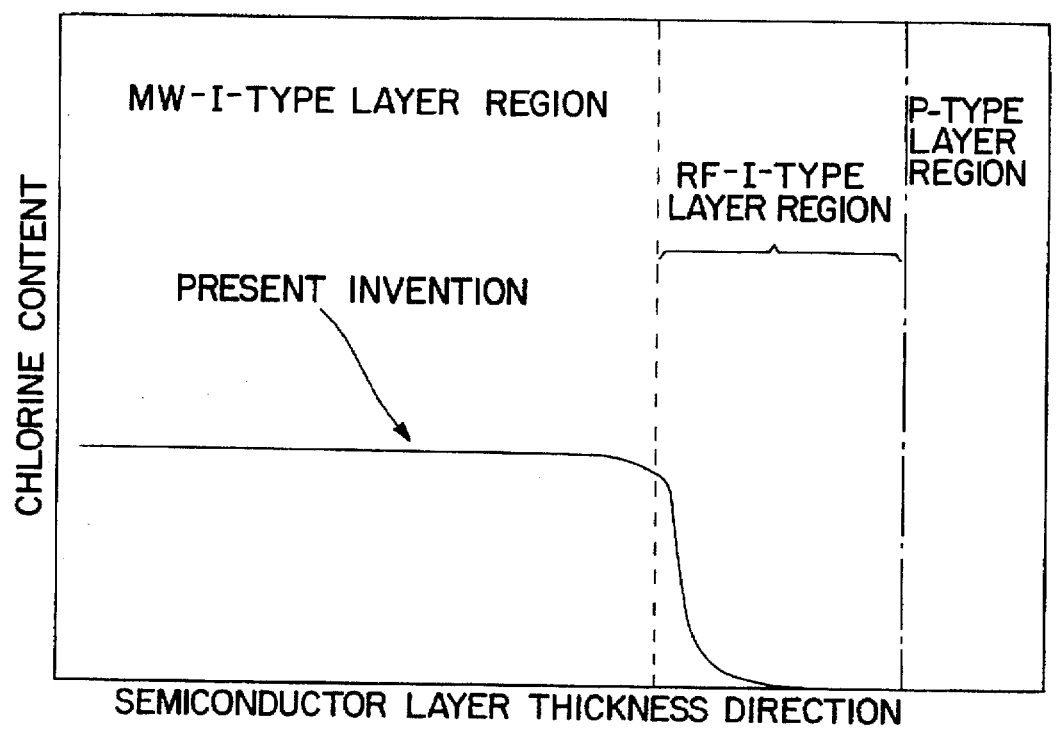
FIG. 3(D) is a schematic explanatory view of a stacked structure comprising a three-layered i-type layer interposed between an n-type layer (not shown) and a p-type layer, said three-layered i-type layer comprising a MW-i-type layer (formed from $SiH_2Cl_2+SiH_4+H_2$ by the MW plasma CVD process) between a pair of RF-i-type layers (formed by the RF plasma CVD process without using any chlorine-containing raw material; of the two RF-i-type layers, the one positioned next to the n-type layer is not shown), in which it is shown that the amount of chlorine atoms incorporated upon the formation of said MW-i-type layer is distributed not only in a partial layer region of the MW-i-type layer but also in a partial layer region of the RF-i-type layer situated next to the p-type layer.

The results obtained for the semiconductor sample B are graphically shown in FIGS. 3(B) and 3(D).

Based on the results shown in FIGS. 3(A) through 3(D), there were obtained the following findings. That is, in the case where a MW-i-type layer with a chlorine content is formed interposed between an n-type layer and a p-type layer with no chlorine content, the chlorine atoms remain in the MW-i-type layer such that their concentration distribution is increased not only in the interface region with the n-type layer but also in the interface region with the p-type layer as shown in FIGS. 3(A) and 3(C).

On the other hand, in the case where a MW-i-type layer with a chlorine content is formed interposed between a pair of RF-i-type layers with no chlorine content, the chlorine content in the MW-i-type layer is diffused into the opposite adjacent RF-i-type layers in a graded pattern decreasing toward the n- and p-type layers but without being diffused into the n-type and p-type layers, as shown in FIGS. 3(B) and 3(D).

Experiment 4

This experiment was conducted in order to confirm whether or not the above described MW-i-type layer is actually effective as an i-type semiconductor layer in a pin junction photovoltaic device.

There were prepared two different element samples I and II.

The element sample I comprised a stacked structure formed on an insulating substrate with a comb-shaped electrode disposed on said stacked structure, said stacked structure comprising an i-type layer interposed between an n-type layer and a p-type layer, and said i-type layer comprising an i-type layer (i) formed by the MW-plasma CVD process.

The element sample II comprised a stacked structure formed on an insulating substrate with a comb-shaped electrode disposed on said stacked structure, said stacked structure comprising an i-type layer interposed between an n-type layer and a p-type layer, and said i-type layer having a three-layered structure comprising an i-type layer (b) formed by the MW-plasma CVD process interposed between a pair of i-type layers (a) and (c), each formed by the RF plasma CVD process.

Each of these element samples I and II was prepared as follows.

The element sample I was prepared by forming by the RF plasma CVD process, on an insulating substrate, an n-type layer from a mixture of a silicon-containing raw material gas containing no chlorine, hydrogen gas, and an n-type dopant-imparting raw material gas forming by the MW plasma CVD process, on said n-type layer, an i-type layer (i) (that is, a MW-i-type layer) from a mixture of a silicon-containing raw material gas, a chlorine-containing raw material gas, and hydrogen gas, forming by the RF plasma CVD process, on said i-type layer (i), a p-type layer from a mixture of a silicon-containing raw material gas containing no chlorine, hydrogen gas, and a p-type dopant-imparting raw material gas and forming, on the p-type layer, a comb-shaped electrode by the vacuum evaporation technique.

The element sample II was prepared by forming by the RF plasma CVD process, an n-type layer from a mixture of a silicon-containing raw material gas containing no chlorine, hydrogen gas, and an n-type dopant-imparting raw material gas, forming by the RF plasma CVD process, on said n-type layer, an i-type layer (a) (that is, a RF-i-type layer) from a mixture of a silicon-containing raw material gas containing no chlorine and hydrogen gas, forming by the MW plasma CVD process, on said i-type layer (a), an i-type layer (b) (that is, a MW-i-type layer) from a mixture of a silicon-containing raw material gas, a chlorine-containing raw material gas, and hydrogen gas, forming by the RF plasma CVD process, on said i-type layer (b), an i-type layer (c) (that is, a RF-i-type layer) from a mixture of a silicon-containing raw material gas containing no chlorine and hydrogen gas, forming by the RF plasma CVD process, on said i-type layer (c), a p-type layer from a mixture of a silicon-containing raw material gas containing no chlorine, hydrogen gas, and a p-type dopant-imparting raw material gas, and forming, on the p-type layer, a comb-shaped electrode by the vacuum evaporation technique.

Each of the resultant element samples I and II, was examined with respect to (i) initial charge carrier mobility and (ii) charge carrier mobility after having been exposed to irradiation of AM 1.5 light of 100 mW/cm$^2$ for 100 hours. The results obtained are collectively shown in the following Table A.

Based on the results obtained in the above, the following was determined. That is, because the residual chlorine atoms in the MW-i-type layer are diffused into each adjacent RF-i-type layer as above described, the concentration distribution of the chlorine atoms in the MW-i-type layer is relaxed in each of the opposite interface regions and as a result, an improvement is provided in the quality of the MW-i-type layer as apparent by reference to the results obtained for the element sample II. However, it is considered that if each adjacent RF-i-type layer does not have a minimum thickness, a problem will entail in that the residual chlorine atoms in the MW-i-type layer are diffused through the RF-i-type layer into the n- or p-type layer to deteriorate the characteristics. It is also considered that if each adjacent RF-i-type layer has an excessive thickness, a problem will entail in that the distance for the charge carriers to travel becomes too long, resulting in causing a reduction in the characteristics such as fill-factor and the like.

In order to determine a desirable thickness for each adjacent RF-i-type layer so that a photovoltaic device with no such problem as above described can be produced, the following experiment was conducted.

The procedures for preparing the foregoing element sample II were repeated, except that each of the RF-i-type layers (a) and (c) was varied as shown in the following Table B, to thereby obtain nine element samples of the same configuration as the above element sample II.

Each of the resultant nine element samples was examined with respect to (i) initial carrier mobility and (ii) carrier mobility after having been exposed to irradiation of AM 1.5 light of 100 mW/cm$^2$ for 100 hours. The results obtained are collectively shown in the following Table B.

Based on the results shown in Tables A and B, the following was determined. That is, (i) in the case of forming an i-type semiconductor layer for a pin junction photovoltaic device by a plasma CVD process using a chlorine-containing raw material gas, a non-chlorine substituted silane series raw material gas, and hydrogen gas, the MW plasma CVD process is the most appropriate, but a problem unavoidably entails in that the residual chlorine atoms in the i-type layer (that is, the MW-i-type layer) are distributed such that their concentration is increased in each interface region with the adjacent n- or p-type semiconductor layer to deteriorate the characteristics of the pin junction photovoltaic device obtained; (ii) in the case where said MW-i-type layer is interposed between a pair of RF-i-type layers formed from a mixture of a non-chlorine substituted silane series raw material gas and hydrogen gas by the RF plasma CVD process, the residual chlorine atoms in the MW-i-type layer, which has a rougher texture than that of each adjacent RF-i-type layer, are diffused into each adjacent RF-i-type layer so that the maximum value of the hydrogen content in the MW-i-type layer is reduced and because of this, an improvement is provided in the characteristics of the entire i-type semiconductor layer; (iii) in order that the residual chlorine atoms in the MW-i-type layer are diffused in a most desirable state, each adjacent RF-i-type layer is desired to have a thickness in the range of 10 to 1000 Å; (iv) in the case where each adjacent RF-i-type layer is of a thickness of less than 10 Å, there is a possibility that the residual chlorine atoms in the MW-i-type layer can diffuse through the RF-i-type layer into the n- or p-type semiconductor layer; on the other hand, in the case where each adjacent RF-i-type layer is of a thickness exceeding 1000 Å, there is a possibility of preventing charge carrier mobility.

With reference to the findings obtained through the above experiments, the present inventors prepared a plurality of pin junction photovoltaic elements each comprising an i-type semiconductor layer with a stacked structure comprising a MW-i-type layer (b) formed by the MW plasma CVD process from a mixture composed of a silicon-containing raw material gas, a chlorine-containing raw material gas in a limited amount, and hydrogen gas interposed between two RF-i-type layers (a) and (c) each having a particular thickness and formed by the RF plasma CVD process from an appropriate silicon-containing raw material gas with no chlorine.

The resultant photovoltaic devices were evaluated. Each of the photovoltaic devices was found to excel in initial photoelectric conversion efficiency and to be hardly degraded even upon continuous exposure to irradiation of light over a long period of time, wherein each of them always and stably exhibited a desirable photoelectric conversion efficiency without being deteriorated.

TABLE A

| i-type layer | carrier mobility (initial value) | carrier mobility (after exposure to light for 100 hours) |
| --- | --- | --- |
| I (MW-i-type layer) | 1.0 | 0.8 |
| II (RF/MW/RF-i-type layer) | 8.9 | 8.5 |

TABLE B

| RF-i-type layer (a) thickness (Å) | RF-i-type layer (c) thickness (Å) | carrier mobility (initial value) | carrier mobility (after exposure to light for 100 hours) |
| --- | --- | --- | --- |
| 5 | 5 | 0.62 | 0.60 |
| 10 | 5 | 0.70 | 0.69 |
| 5 | 10 | 0.78 | 0.75 |
| 10 | 10 | 1.00 | 1.00 |
| 500 | 10 | 1.05 | 1.07 |
| 1000 | 1000 | 1.07 | 1.10 |
| 1200 | 1000 | 0.80 | 0.75 |
| 1000 | 1200 | 0.75 | 0.69 |
| 2000 | 1500 | 0.68 | 0.70 |

The present invention has been accomplished based on the foregoing findings obtained through the above described experiments.

The present invention includes a photovoltaic device comprising a substrate and a multi-layered semiconductor active layer having a pin junction structure disposed on said substrate, said multi-layered semiconductor active layer comprising a non-single crystal semiconductor layer of n- or p-type, an i-type non-single crystal semiconductor layer and a non-single crystal semiconductor layer of p- or n-type stacked in this order from the substrate side, characterized in that said i-type semiconductor layer comprises an i-type non-single crystal layer (b) (that is, a MW-i-type layer) formed by the MW plasma CVD process interposed between a pair of i-type non-single crystal layers (a) and (c) (that is, RF-i-type layers) each formed by the RF plasma CVD process, said i-type layer (b) comprising an i-type non-single crystal layer formed by the MW plasma CVD process from a mixture of a silane series gas not containing chlorine atom, a chlorine-containing raw material gas in an amount of 10% of the total amount of the chlorine-free silane gas and the chlorine-containing raw material gas, and hydrogen gas.

The photovoltaic thus constituted according to the present invention excels not only in I-V characteristics (current-voltage characteristics) but also in initial photoelectric conversion efficiency and stably and continuously exhibits a desirable photoelectric conversion efficiency without being deteriorated over a long period of time and which is hardly deteriorated even when it is continuously used under severe environmental conditions of high temperature and high humidity over a long period of time while being exposed to irradiation of light.

Figure 4:
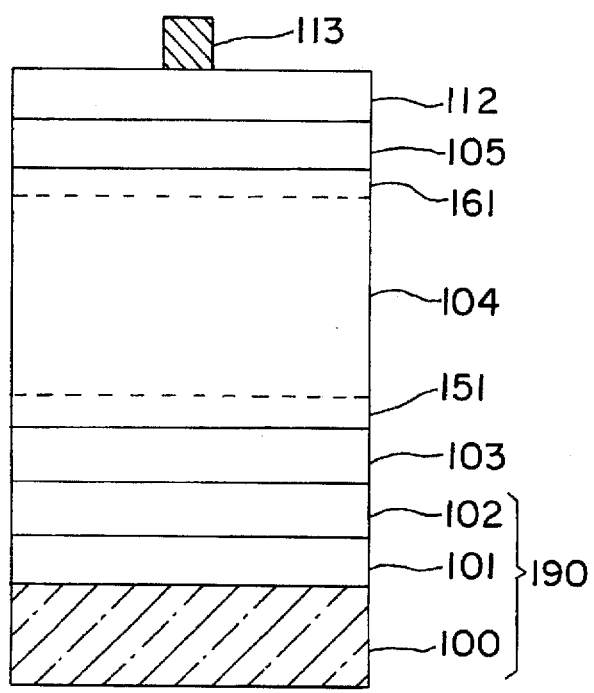
FIG. 4 is a schematic cross-sectional view of an example of a photovoltaic device according to the present invention.
Figure 5:
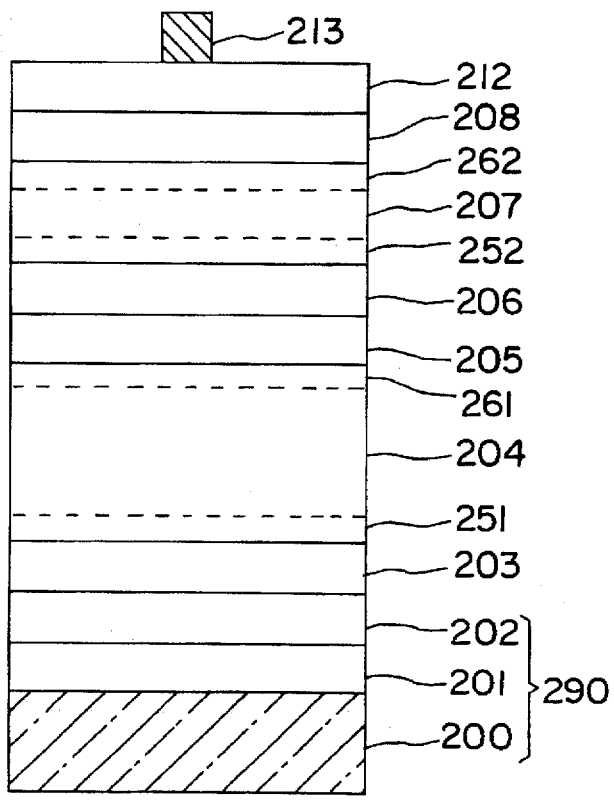
FIG. 5 is a schematic cross-sectional view of another example of a photovoltaic device according to the present invention.
Figure 6:
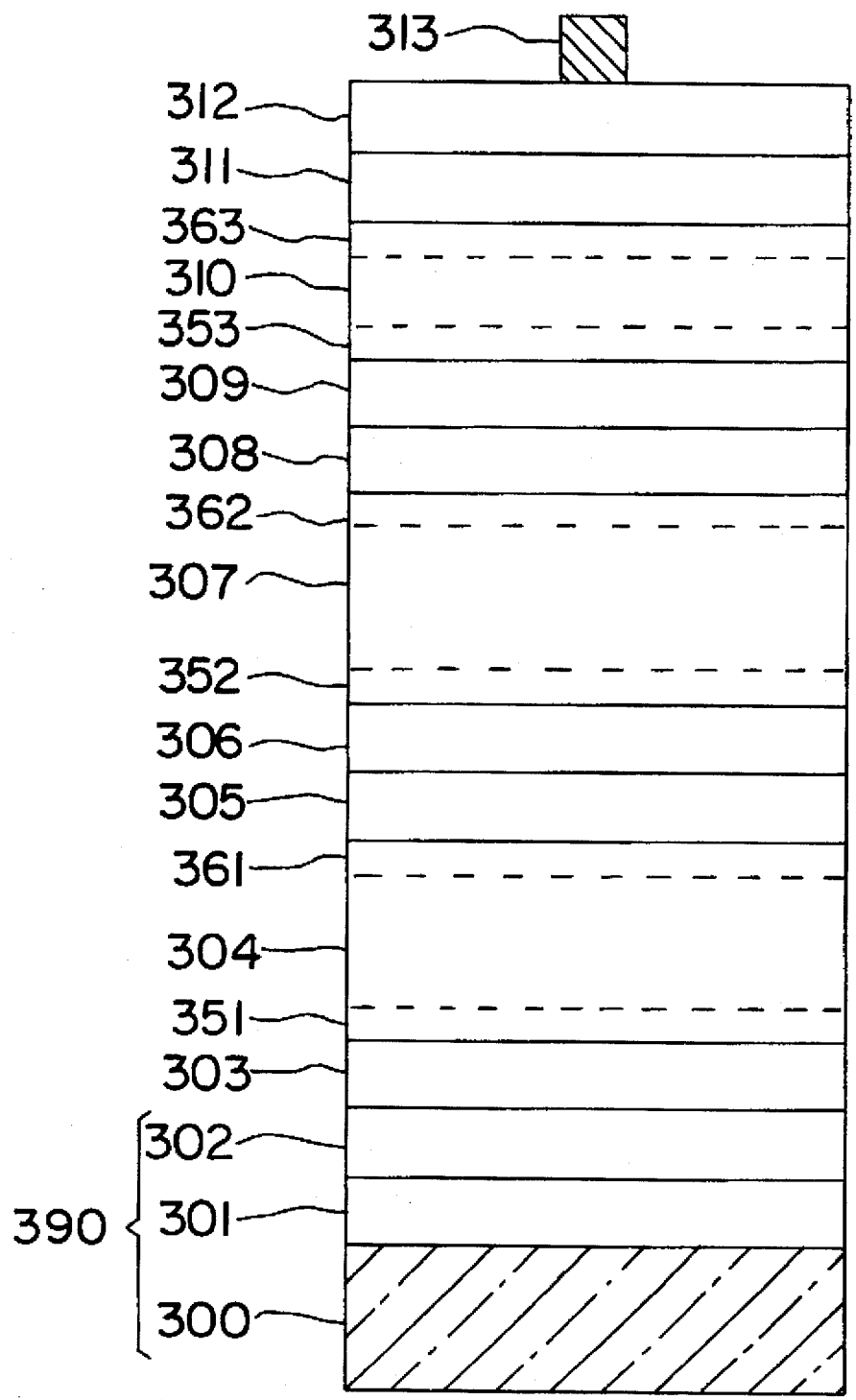
FIG. 6 is a schematic cross-sectional view of a further example of a photovoltaic device according to the present invention.

The photovoltaic device according to the present invention may take any of the configurations shown in FIGS. 4 to 6. Description will now be made of these photovoltaic devices shown in FIGS. 4 to 6.

FIG. 4 is a schematic cross-sectional view of a single cell type photovoltaic device having a single pin junction cell according to the present invention. The photovoltaic device shown in FIG. 4 basically comprises a substrate 100, an n- or p-type semiconductor layer 103 disposed on the substrate 100, a multilayered i-type semiconductor layer comprising (i-a) a substantially intrinsic semiconductor layer 151 formed by the RF plasma CVD process (this semiconductor layer will be hereinafter referred to as RF-i-type layer), (i-b) a substantially intrinsic semiconductor layer 104 formed by the MW-CVD process (this semiconductor layer will be hereinafter referred to as MW-i-type layer) and (i-c) a substantially intrinsic semiconductor layer 161 formed by the RF plasma CVD process (this semiconductor layer will be hereinafter referred to as RF-i-type layer) stacked in the named order on the semiconductor layer 103, a p- or n-type semiconductor layer 105 disposed on the RF-i-type layer 161, a transparent electrode 112 disposed on the semiconductor layer 105, and a collecting electrode 113 disposed on the transparent electrode 112. This photovoltaic device is of the type wherein light is impinged through the side opposite the substrate. Thus, it is desired for the substrate 100 to be configured as shown by reference numeral 190 wherein a reflection layer 101 and/or a reflection promotion layer 102 are disposed on the substrate. In the case where the photovoltaic device is used in such a way that light is impinged through the substrate side, it is desired that the substrate 100 be transparent, the layer 101 be a transparent and conductive layer, and the layer 102 be an electroconductive layer capable of serving also as a reflection layer.

FIG. 5 is a schematic cross-sectional view of a tandem cell type photovoltaic device having two pin junction cells according to the present invention.

The tandem type photovoltaic device shown in FIG. 5 basically comprises a substrate 200, a first cell having a pin junction disposed on the substrate 200, a second cell having a pin junction stacked on the first cell, a transparent electrode 212 disposed on the second cell, and a collecting electrode 213 disposed on the transparent electrode 212, wherein the first cell comprises: an n- or p-type semiconductor layer 203, a multilayered i-type semiconductor layer comprising (i-a) a substantially intrinsic semiconductor layer 251 formed by the RF plasma CVD process (this semiconductor layer will be hereinafter referred to as RF-i-type layer), (i-b) a substantially intrinsic semiconductor layer 204 formed by the MW-CVD process (this semiconductor layer will be hereinafter referred to as MW-i-type layer) and (i-c) a substantially intrinsic semiconductor layer 261 formed by the RF plasma CVD process (this semiconductor layer will be hereinafter referred to as RF-i-type layer) stacked in the named order, and a p- or n-type semiconductor layer 205 disposed on the RF-i-type layer 261; and the second cell comprises: an n or p-type semiconductor layer 206, a multilayered i-type semiconductor layer comprising (i-a) a substantially intrinsic semiconductor layer 252 formed by the RF plasma CVD process (that is, a RF-i-type layer), (i-b) a substantially intrinsic semiconductor layer 207 formed by the MW-CVD process (that is, a MW-i-type layer) and (i-c) a substantially intrinsic semiconductor layer 262 formed by the RF plasma CVD process (that is, a RF-i-type layer) stacked in the named order, and a p- or n-type semiconductor layer 208. This photovoltaic device is of the type wherein light is impinged through the side opposite the substrate. Thus, it is desired for the substrate 200 to be configured as shown by reference numeral 290 wherein a reflection layer 201 and/or a reflection promotion layer 202 are disposed on the substrate. In the case where the photovoltaic device is used in such a way that light is impinged through the substrate side, it is desired that the substrate 200 be transparent, the layer 201 be a transparent and conductive layer, and the layer 202 be an electroconductive layer capable of serving also as a reflection layer.

FIG. 6 is a schematic cross-sectional view of a triple cell type photovoltaic device having three pin junction cells according to the present invention.

The triple cell type photovoltaic device shown in FIG. 6 basically comprises a substrate 300, a first cell having a pin junction disposed on the substrate 300, a second cell having a pin junction stacked on the first cell, a third cell having a pin junction stacked on the second cell, a transparent electrode 312 disposed on the third cell, and a collecting electrode 313 disposed on the transparent electrode 312, wherein the first cell comprises: an n- or p-type semiconductor layer 303, a multilayered i-type semiconductor layer comprising (i-a) a substantially intrinsic semiconductor layer 351 formed by the RF plasma CVD process (this semiconductor layer will be hereinafter referred to as RF-i-type layer), (i-b) a substantially intrinsic semiconductor layer 304 formed by the MW-CVD process (this semiconductor layer will be hereinafter referred to as MW-i-type layer) and (i-c) a substantially intrinsic semiconductor layer 361 formed by the RF plasma CVD process (this semiconductor layer will be hereinafter referred to as RF-i-type layer) stacked in the named order, and a p- or n-type semiconductor layer 305 disposed on the RF-i-type layer 361; the second cell comprises: an n- or p-type semiconductor layer 306, a multilayered i-type semiconductor layer comprising (i-a) a substantially intrinsic semiconductor layer 352 formed by the RF plasma CVD process (that is, a RF-i-type layer), (i-b) a substantially intrinsic semiconductor layer 307 formed by the MW-CVD process (that is, a MW-i-type layer) and (i-c) a substantially intrinsic semiconductor layer 362 formed by the RF plasma CVD process (that is, a RF-i-type layer) stacked in the named order, and a p- or n- type semiconductor layer 308 disposed on the RF-i-type layer 362; and the third cell comprises: an n- or p-type semiconductor layer 309, a multilayered i-type semiconductor layer comprising (i-a) a substantially intrinsic semiconductor layer 353 formed by the RF plasma CVD process (that is, a RF-i-type layer), (i-b) a substantially intrinsic semiconductor layer 310 formed by the MW-CVD process (that is, a MW-i-type layer) and (i-c) a substantially intrinsic semiconductor layer 363 formed by the RF plasma CVD process (that is, a RF-i-type layer) stacked in the named order, and a p- or n-type semiconductor layer 311. This photovoltaic device is of the type wherein light is impinged through the side opposite the substrate. Thus, it is desired for the substrate 300 to be configured as shown by reference numeral 390 wherein reflection layer 301 and/or a reflection promotion layer 302 are disposed on the substrate. In the case where the photovoltaic device is used in such a way that light is impinged through the substrate side, it is desired that the substrate 300 be transparent, the layer 301 be a transparent and conductive layer, and the layer 302 be an electroconductive layer capable of serving also as a reflection layer.

In the following, description will be made of each constituent of the photovoltaic devices shown in FIGS. 4 to 6 according to the present invention.

I-Type Semiconductor Layer

The i-type semiconductor layer in the photovoltaic device according to the present invention comprises a three-layered structure comprising a MW-i-type layer interposed between a pair of RF-i-type layers, wherein the MW-i-type layer is formed by the MW plasma CVD process from a mixture of a silane series gas not containing chlorine atom(s), a chlorine-containing raw material gas in an amount of 10% of the total amount of the chlorine-free silane gas and the chlorine-containing raw material gas, and hydrogen gas, and each RF-i-type layer is typically an i-type layer formed by the RF plasma CVD process from a mixture of a silicon-containing raw material gas not containing chlorine atom(s) and hydrogen gas.

The three-layered i-type semiconductor layer plays an important role in making the photovoltaic device according to the present invention excel not only in I-V characteristics (current-voltage characteristics) but also in initial photoelectric conversion efficiency and to stably and continuously exhibit a desirable photoelectric conversion efficiency without being deteriorated over a long period of time and be hardly deteriorated even when it is continuously used under severe environmental conditions of high temperature and high humidity over a long period of time while being exposed to irradiation of light.

Description will now be made of the MW-i-type layer and the RF-i-type layer.

MW-i-type layer

As above described, the MW-i-type layer is formed by applying a predetermined microwave power with a desired frequency to cause microwave glow discharge (hereinafter referred to as MW glow discharge) in a mixture of a silane series gas not containing chlorine atom(s) (hereinafter referred to as chlorine-free silane series gas), a chlorine-containing raw material gas (for example, $SiH_2Cl_2$) in an amount of 10% of the total amount of the chlorine-free silane gas and the chlorine-containing raw material gas. This film formation is conducted such that chlorine atoms supplied from the chlorine-containing raw material gas incorporated in a film deposited during the formation are extracted therefrom so as to relax the film structure thereof, thereby improving the quality of the deposited film. As the frequency of the microwave power (the MW power) in this case, it is desired to be 2.45 G Hz.

During the above formation of the MW-i-type layer, it is possible to control the plasma potential caused upon the MW glow discharge by applying a predetermined bias voltage of DC (direct current), AC (alternating current) or RF (high frequency) through an appropriate bias voltage applying electrode to impart energy to ions in the plasma, whereby the surface reaction of the deposited film on the substrate is facilitated to effectively extract chlorine atoms and other atoms having a large atomic radius from the deposited film, thereby further stabilizing the film structure of the deposited film. As for the frequency of the applied AC or RF, it is desired to be in the range from 10 Hz to 500 M Hz. In the case where DC or AC is employed, a voltage in the range from 10 V to 500 V is desirable. Further, in the case where RF is employed, it is desired to be applied with a power of 0.06 to 10 $W/cm^2$.

As for the deposition rate during the formation of the MW-i-type layer, it should be determined with due concern about the electrical contacts among the layers formed, the productivity, production cost, and the like. However, in general, it is desired to be in the range from 10 Å/sec. to 200 ÅÅ/sec. In order to attain such deposition rate, the MW power applied is necessary to be in the range from 0.02 $W/cm^3$ to 0.02 $W/cm^3$.

In order to attain the formation of the MW-i-type layer in a desirable state by the MW plasma CVD process, the pressure in the deposition space during the formation of the MW-i-type layer is an important factor. Specifically, it is desired to be 50 mTorr or less in view of preventing the chlorine-containing raw material gas from polymerizing with the chlorine-free silane series gas. In order to prevent the deposition rate from being significantly lowered, the pressure is desired to be 0.1 mTorr or more.

Further, in order to attain the formation of the MW-i-type layer in a desirable state by the MW plasma CVD process, the substrate temperature is also an important factor. Specifically, it is desired to be in the range from 250° C. to 400° C. However, when the deposition rate is low, it is desired to employ a substrate temperature in the lower end of this temperature range, and when the deposition rate is high, it is desired to employ a substrate temperature in the higher end of this temperature range.

The thickness of the MW-i-type layer also is an important factor governing the characteristics of the photovoltaic device. Particularly, the thickness of the MW-i-type layer should be determined depending upon the desired current value, electromotive force, and fill-factor. However, in general, it is desired to be in the range from 100 Å to 3000 Å.

More particularly, in the case where the MW-i-type layer is constituted by a non-single crystal material such as a hydrogenated amorphous silicon material and it is used in an i-type semiconductor layer of a top cell in a triple cell type photovoltaic device of the type wherein light is impinged through the top cell side, the thickness is desired to be in the range from 500 Å to 2000 Å. Similarly, in the case where the MW-i-type layer is constituted by a non-single crystal material such as a hydrogenated amorphous silicon material and it is used in an i-type semiconductor layer of each of the middle cell and bottom cell in said triple cell type photovoltaic device, the thickness is desired to be in the range from 500 Å to 3000 Å.

The chlorine-containing raw material gas used in the formation of the MW-i-type layer includes conventional gaseous or easily gasifiable chlorine-containing raw materials capable of being used for film formation. Specific examples are $SiH_2Cl_2$, $SiHCl_3$, and $SiCl_4$. These raw materials may be used either singly or in combination of two or more of them. It is desired for these raw materials to be introduced into the deposition space together with an appropriate carrier gas such as He gas, Ar gas, Kr gas, or $H_2$ gas.

The chlorine-free silane series gas used in the formation of the MW-i-type layer includes conventional gaseous or easily gasifiable chlorine-free silane series raw materials capable of being used for film formation. Specific examples are $SiH_4$, $Si_2H_6$, $Si_3H_8$, $SiD_4$, $SiHD_3$, $SiH_2D_2$, $SiH_3D$, $SiH_3D_3$. These raw materials may be used either singly or in combination of two or more of them.

In the case where the photovoltaic device according to the present invention has a plurality of pin junction structures, it is desired to design the respective MW-i-type layers such that their band gaps are gradually decreased from the side through which light is impinged. In order for the MW-i-type layer to have a relatively greater band gap, the layer is desired to be constituted by a non-single crystal silicon carbide. On the other hand, in order for the MW-i-type layer to have a relatively smaller band gap, the layer is desired to be constituted by a non-single crystal silicon-germanium material.

The formation of such MW-i-type non-single crystal silicon carbide layer can be conducted by additionally using a gaseous or easily gasifiable raw material capable of supplying C, such as $CH_4$, $CD_4$, $C_nH_{2n+2}$ (with n being an integer), $C_nH_{2n}$ (with n being an integer), $C_2H_2$, and $C_6H_6$.

The formation of such MW-i-type non-single crystal silicon-germanium layer can be conducted by additionally using a gaseous or easily gasifiable raw material capable of supplying Ge such as $GeH_4$, $GeD_4$, $GeHD_3$, $GeH_2D_2$, $GeH_3D$, $Ge_2H_6$, and $Ge_2D_6$.

When the MW-i-type layer is incorporated with an element belonging to group III of the periodic table (this element will be hereinafter referred to as group III element), its resistance to light degradation is further improved. Particularly, in this case, the product of hole mobility and lifetime is increased. As for the amount of the group III element to be incorporated into the MW-i-type layer, it is desired to be in the range from 0.01 ppm to 30 ppm.

The incorporation of such group III element into the MW-i-type layer can be conducted by additionally using a gaseous or easily gasifiable raw material capable of supplying the group III element. Specific examples of such raw materials capable of supplying the group III element are $B_2H_6$, $B_4H_{10}$, $B_5H_9$, $B_5H_{11}$, $B_6H_{10}$, $B_6H_{12}$, $B_6H_{14}$. Of these, $B_2H_6$ is the most appropriate.

In addition to the group III element, it is possible to incorporate also an element belonging to group V of the periodic table (this element will be hereinafter referred to as group V element) into the MW-i-type layer. In this case, a further improvement is provided in the resistance to light degradation. As for the total amount of the group III element and the group V element to be incorporated into the MW-i-type layer, it is desired to be in the range from 10 ppm to 500 ppm.

The incorporation of such group V element into the MW-i-type layer can be conducted by additionally using a gaseous or easily gasifiable raw material capable of supplying the group V element. Specific examples of such raw material capable of supplying the group V element are gaseous or easily gasifiable phosphorous hydrides such as $PH_3$, $P_2H_4$, $AsH_3$, $SbH_3$, and $BiH_3$.

The MW-i-type layer may be controlled to have a desired band gap by incorporating at least one atom selected from the group consisting of carbon, nitrogen, and oxygen. In this case, the photovoltaic device is improved in terms of the open circuit voltage.

RF-i-type layer

Each of the two RF-i-type layers between which the MW-i-type layer is interposed is a very important factor in the photovoltaic device according to the present invention. That is, each RF-i-type layer functions as a layer into which the residual chlorine atoms in the MW-i-type layer are diffused.

The RF-i-type layer is constituted by a non-single crystal semiconductor material such as an amorphous silicon material (including microcrystalline silicon materials). The amorphous silicon material by which the RF-i-type layer is constituted is desired to contain hydrogen atoms in an amount in the range of from 1 to 40 atomic %. In this case, dangling bonds of the silicon atoms in the RF-i-type layer are compensated by the hydrogen atoms to improve the carrier mobility and lifetime.

The thickness of each of the two RF-i-type layers should be determined with due regard about the MW-I-type layer. However, in general, it is desired to be in the range from 10 Å to 1000 Å.

The RF-i-type layer is formed by the RF plasma CVD process wherein glow discharge is caused in a gas atmosphere composed of an appropriate film-forming raw material gas and if necessary, hydrogen gas, in the deposition space by applying a desired RF power.

Specific examples of the raw material used for the formation of the RF-i-type layer constituted by a non-single crystal silicon material are $SiH_4$, $Si_2H_6$, $Si_3H_8$, $SiD_4$, $SiDH_3$, $SiH_2D_2$, $SiH_3D$, $Si_2H_3D_3$, and the like.

The formation of the RF-i-type layer in a desirable state by the RF plasma CVD process can be attained by properly adjusting the film-forming parameters. Specifically, the formation of the RF-i-type layer is desired to be conducted under conditions of 100° to 350° C. for the substrate temperature, 0.05 to 10 Torr for the pressure in the deposition space, 1 to 50 MHz (preferably, 13.56 MHz in view of convenience) for the frequency of the RF, and 0.01 to 5 $W/cm^2$ for the RF power applied. As for the self-bias applied to the substrate by the RF power, it is desired to be in the range from 0 to 300 V.

In the case where the RF-i-type layer is constituted by a microcrystalline semiconductor material which has only slight light absorption, the formation thereof is desired to be conducted by diluting the foregoing film-forming raw material gas 2 to 100 times with hydrogen gas and applying a relatively increased RF power.

Substrate

The substrate serves as a support for holding the stacked layer structure of the solar cell and because of this, it is necessary to be constituted by a material which is free of deformation or distortion due to heating upon film formation and which excels in physical strength. Further, in the case where the substrate is designed so as to serve also as a power outputting electrode, it is necessary for the substrate to have electrical conductivity. Further, in the case where the reflection layer and/or the reflection promotion layer are disposed on the substrate, the substrate must have good adhesion with the reflection layer and the reflection promotion layer even in the case where the substrate having the reflection layer and/or the reflection promotion layer thereon is exposed to plasma upon forming a film thereon.

Specifically, the substrate may be electroconductive or electrically insulating. The electroconductive substrate can include, for example, plate or film-like members of metals such as Ni, Cr, Al, Cr, Mo, Au, Ir, Nb, Ag, etc. and alloys of these metals such as stainless steel and Ni—Cr alloy. These plates and film-like members may be applied on the surface thereof with a different metal thin film or/and a thin film of an insulating material by means of a conventional sputtering, vacuum evaporation, or plating technique. Specific examples of such insulating material are $SiO_2$, $Si_3N_4$, $Al_2O_3$, and AlN.

The electrically insulating substrates can include, for example, films or sheets of heat resistant synthetic resins such as polyimide, polyamide, polyethylene terephthalate, epoxy resin, and films or sheets of heat resistant inorganic materials such as glass, ceramics, etc.

Besides the above, the substrate may comprise other appropriate materials such as glass fiber, carbon fiber, boron fiber, or metal fiber.

As for the thickness of the substrate, thinner substrates are preferred in view of the production cost, the storage space and the like, as long as it is within a range wherein a sufficient strength is exhibited so that the substrate can be maintained in a given shape when the substrate is moved. However, in general, the thickness of the substrate is preferably in the range of 0.01 mm to 5 mm, more preferably in the range of 0.02 mm to 2 mm, most preferably in the range of 0.05 mm to 1 mm.

N-Type Semiconductor Layer and P-Type Semiconductor Layer

Each of the n-type semiconductor layer and the p-type semiconductor layer may be formed of a suitable non-single crystalline semiconductor material doped with an appropriate dopant. Specific examples of such non-single crystalline semiconductor materials are amorphous semiconductor materials of n- or p-type such as a-Si:H, a-SiC:H, a-SiGe:H, a-SiGeC:H, a-SiO:H, a-SiN:H, and the like which have been doped with a proper n- or p-type dopant; microcrystalline (hereinafter referred to as "μc") semiconductor materials of n- or p-type such as μc-Si:H, μc-SiC:H, μc-SiGe:H, μc-SiO:H, μc-SiGeC: H, μc-SiN:H, and the like which have been doped with a proper n- or p-type dopant; and polycrystalline (hereinafter referred to as "poly") semiconductor materials such as poly-Si:H, poly-SiC:H, poly-SiGe:H, poly-Si, poly-SiC, poly-SiGe, and the like which have been doped with a proper n- or p-type dopant. Specific examples of the n-type dopants are group V elements of the periodic table such as P, As, Sb, and Bi. Specific examples of the p-type dopants are group III elements of the periodic table such as B, Al, Ga, In and Tl.

As for the p-type semiconductor layer or the n-type semiconductor layer situated on the side through which light is impinged, it is desired for the layer to be constituted by a microcrystalline semiconductor material which only slightly absorbs light or an amorphous semiconductor material having a wide band gap, in order to facilitate light impingement of the i-type semiconductor layer.

As for the amount of the p-type dopant contained in the p-type semiconductor layer, it is desired to be in the range of 0.1 to 50 atomic %. Similarly, the amount of the n-type dopant contained in the n-type semiconductor layer is desired to be in the range of 0.1 to 50 atomic %.

It is desired for either or both of the p-type semiconductor layer and the n-type semiconductor layer to contain hydrogen atoms (H) because the H atoms passivate dangling bonds and enhance the doping efficiency. As for the amount of hydrogen atoms to be contained in the p-type semiconductor layer and the n-type semiconductor layer, it is desired to be in the range of 0.} to 40 atomic %. However, in the case where the p-type semiconductor layer or the n-type semiconductor layer is constituted by a crystalline semiconductor material, the amount of the hydrogen atoms contained therein is desired to be in the range of 0.1 to 8 atomic %.

As for the thickness of each of the p-type semiconductor layer and the n-type semiconductor layer, it may be properly determined in consideration of the interrelation with the i-type semiconductor layer.

Specifically, the n-type layer is desired to have a thickness of 30 to 100 Å. The p-type layer is desired to have a thickness of 10 to 500 Å.

The p- or n-type semiconductor layer constituted by any of the foregoing materials may be formed by the conventional plasma CVD process wherein glow discharge is caused in deposition chamber containing appropriate film-forming raw material gases capable of formation of such layer. In the case where the p- or n-type semiconductor layer is formed by the RF plasma CVD process, the formation thereof is desired to be conducted using a RF power (of 1 to 50 MHz, preferably of 13.56 MHz in frequency) of 0.01 to 5 W/cm² under conditions of 100° to 350° C. for the substrate temperature, 0.05 to 10 Torr for the pressure of the deposition chamber, and 0 to 300 V in self-bias voltage of the substrate.

Transparent Electrode

The transparent electrode is desired to have a light transmittance of 85% or more so that it allows each semiconductor layer to efficiently absorb sunlight or fluorescent light. In addition to this, it is desired to have a sheet resistance of 100Ω or less from the viewpoint of preventing the internal resistance of the pin junction semiconductor active region from becoming great, thereby reducing the performance.

In view of the above, the transparent electrode is desired to comprise a thin film of a metal oxide selected from the group consisting of $SnO_2$, $In_2O_3$, ZnO, CdO, $Cd_2SnO_4$, and ITO ($In_2O_3+SnO_2$), or a semitransparent thin film of a metal selected from the group consisting of Au, Al, and Cu.

In the case of a photovoltaic device of the type wherein light is impinged through the side opposite the substrate, the transparent electrode is disposed on the p-type semiconductor layer or the n-type semiconductor layer. And in the case of a photovoltaic device of the type wherein light is impinged through the substrate side wherein the substrate is translucent, the transparent electrode is disposed on the translucent substrate. Thus, in any case, it is necessary for the transparent electrode to be constituted by a thin film selected from those above mentioned which have good adhesion to the semiconductor layer involved or the translucent substrate.

Further, it is desired for the transparent electrode to have such a thickness that satisfies the antireflection condition.

The transparent electrode comprising such thin film as above described may be formed by means of a conventional resistance heating evaporation, electron beam evaporation, sputtering, or spraying technique.

Collecting Electrode

The collecting electrode is disposed on the transparent electrode for the purpose of reducing the sheet resistance of the transparent electrode.

The collecting electrode is desired to comprise a thin film of a metal selected from the group consisting of Ag, Cr, Au, Ni, Mo, and Al. The collecting electrode may be formed by a screen printing process using a Ag-paste. The collecting electrode may also be formed by a vacuum evaporation technique wherein a patterned thin film of Cr, Ag, Au, Cu, Ni, Mo, or Al is formed by means of a conventional vacuum evaporation technique using a patterned mask. Alternatively, the collecting electrode may be formed by adhering a metal wire of Cu, Au, Ag, or Al coated with a conductive resin onto the surface of the photovoltaic device.

Reflection Layer

The reflection layer is disposed especially in the case where the substrate is comprised of an electrically insulating material. The reflection layer in this case serves also as an electrode. The reflection layer may be formed of a thin film of a metal selected from the group consisting of Ag, Au, Pt, Ni, Cr, Cu, Al, Ti, Zn, Mo and W or an alloy of these metals. The reflection layer may be formed by a conventional vacuum evaporation, electron beam evaporation, or sputtering technique. It is desired to have a sheet resistance of preferably 50Ω or less, more preferably 10Ω or less from the viewpoint of preventing the reflection layer from becoming a resistance component for the power outputted from the photovoltaic device.

In the case of a photovoltaic device of the type wherein light is impinged from the substrate side and the substrate is translucent, it is desired that a translucent and electrically conductive layer be formed instead of the reflection layer. The translucent and electrically conductive layer in this case is desired to be constituted by a material selected from the group consisting of $SnO_2$, $In_2O_3$, and alloys of these metal oxides. Further, the translucent and electrically conductive layer is desired to have such a thickness that it can function to prevent light from being reflected. For this purpose, the translucent and electrically conductive layer is desired to have a sheet resistance of preferably $50\Omega$ or less, more preferably $10\Omega$ or less.

Reflection Promotion Layer

The reflection promotion layer is disposed for the purpose of facilitating efficient reflection of sunlight or fluorescent light from the reflection layer into the pin junction semiconductor active region. The reflection promotion layer is desired to have a light transmittance of 85% or more. In addition to this, the reflection promotion layer is desired to have a sheet resistance of preferably $100\Omega$ or less from the viewpoint of preventing the reflection promotion layer from becoming a resistance component for power outputted from the photovoltaic device.

The reflection promotion layer may be constituted by a thin film of a metal oxide selected from the group consisting of $SnO_2$, $In_2O_3$, ZnO, CdO, $Cd_2SnO_4$, and ITO ($In_2O_3$+$SnO_2$). The reflection promotion layer is disposed in contact with the n- or p-type semiconductor layer and because of this, it is necessary to be constituted by a metal oxide thin film which has good adhesion to such semiconductor layer.

The reflection promotion layer is desired to be formed with such a thickness that satisfies the conditions required therefor.

The reflection promotion layer comprising such a thin film as above described may be formed by means of a conventional resistance heating evaporation, electron beam evaporation, sputtering, or spraying technique.

Figure 8:
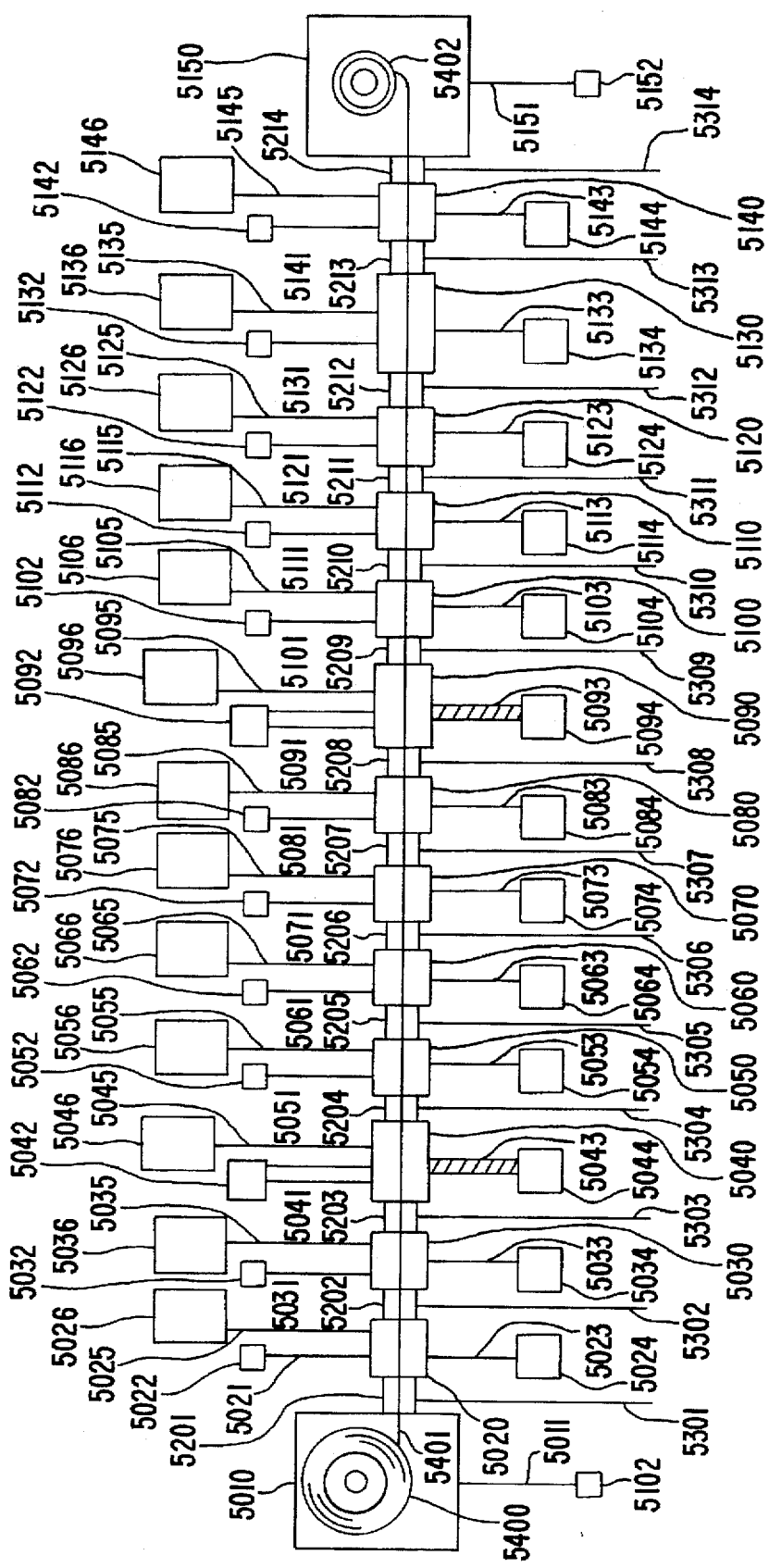
FIG. 8 is a schematic diagram of a roll-to-roll type film-forming apparatus suitable for the preparation of a photovoltaic device according to the present invention.

The photovoltaic device according to the present invention may be produced by an appropriate film-forming apparatus, for instance, as shown in FIG. 7 or FIG. 8.

Description will now be made of each of the film-forming apparatus shown in FIGS. 7A and 7B and 8.

Shown in FIG. 7A is a multichambered type film-forming apparatus. In FIG. 7A, reference numeral 400 indicates the entire multichambered division type film-forming apparatus. The film-forming apparatus 400 comprises a load lock chamber 401, an n- or p-type layer transportation chamber 402, a MW-i- or RF-i-layer transportation chamber 403, a p- or n-type layer transportation chamber 404, an unload chamber 405, gate valves 406, 407, 408, and 409, substrate heating mechanisms 410, 411, and 412, a substrate transportation rail 413, an n- or p-type layer deposition chamber 417, a RF power supply cap 420, a RF power source 422, a MW-i- or RF-i-layer deposition chamber 418, a microwave introducing window 425, a waveguide 426, a shutter 427 for the formation of a MW-i-layer, a bias electrode 428, a bias power source 424, a p- or n-type layer deposition chamber 419, a RF power supply cap 421, a RF power source 423, a raw material gas supply pipe 429 for the formation of an n- or p-type layer, cut-off valves 430, 431, 432,433, 434, 441, 442, 443, and 444, mass flow controllers 436, 437, 438, and 439, a raw material gas supply pipe 449 for the formation of a MW-i- or RF-i-layer, cut-off valves 450, 451, 452, 453, 454, 455, 461, 462, 463, 464, and 465, mass flow controllers 456, 457, 458, 459, and 460, a raw material gas supply pipe 469 for the formation of a p- or n-type layer, cut-off valves 470, 471, 472, 473, 474, 481, 482, 483, and 484, and mass flow controllers 476, 477, 478, and 479. In addition, the film-forming apparatus 400 is also provided with an exhaust system having a vacuum mechanism including a diffusion pump, a mechanical booster pump, and a rotary pump, a mechanism for cooling the apparatus, and the like (these are not shown in the figure).

The production of a photovoltaic device according to the present invention using the film-forming apparatus shown in FIG. 7A can be conducted, for example, in the following manner.

Firstly, all the transportation chambers and the deposition chambers are evacuated to a vacuum of about $1\times10^{-6}$ Torr. A substrate is positioned on a substrate holder 490, and the substrate holder is introduced into the load lock chamber 401. The load lock chamber 401 is evacuated to a vacuum of about $1\times10^{-3}$ Torr by operating a mechanical booster pump and rotary pump (not shown in the figure), followed by further vacuuming to a vacuum of about $1\times10^{-6}$ Torr by means of a turbo-molecular pump (not shown in the figure). The gate valve 406 is opened, the substrate holder 490 is transferred into the transportation chamber 402, and the gate valve 406 is closed. The substrate on the substrate holder 490 is moved below the substrate heating mechanism 410 and the substrate heating mechanism is lowered so that the substrate on the substrate holder 490 is positioned in the deposition chamber 417, wherein the gas pressure is controlled to a pressure substantially equivalent to a given gas pressure employed upon film formation by flowing hydrogen gas, and the substrate is heated to and maintained at a desired temperature by the substrate heating mechanism 410. Then, the formation of an n- or p-type layer is conducted in the deposition chamber 417. Raw material gases for the formation of an n- or p-type layer are introduced into the deposition chamber 417 through the gas supply pipe 429 while operating the mass flow controllers 436–439 and the cut-off valves 441–444 and 430–434. The gas pressure in the deposition chamber 417 is controlled to and maintained at a desired pressure suitable for the formation of the n- or p-type layer. The RF power source 422 is switched on to apply a desired RF power through the RF power supply cup 420 into the deposition chamber 417, wherein film formation is conducted for a desired period of time to form an n- or p-type layer having a desired thickness on the substrate. After this, the application of the RF power is terminated, and the introduction of the raw material gases is terminated. Then, the deposition chamber 417 is evacuated to a vacuum of about $1\times10^{-6}$ Torr by operating the turbo-molecular pump. The substrate heating mechanism 410 is lifted, the gate valve 407 is opened, and the substrate holder is transferred into the transportation chamber 403. Thereafter, the gate valve 407 is closed. As shown in FIG. 7B, which is an expanded view of the deposition chamber 418, the substrate on the substrate holder 490 is moved below the substrate heating mechanism 411 and the substrate heating mechanism 411 is lowered so that the substrate on the substrate holder 490 is positioned in the deposition chamber 418, wherein the gas pressure is controlled to a pressure substantially equivalent to a given gas pressure employed upon film formation by flowing hydrogen gas, and the substrate is heated to and maintained at a desired temperature by the substrate heating mechanism 411. Then, the formation of a RF-i-layer and a MW-i-layer is conducted in the deposition chamber 418. The RF-i-layer is firstly formed. That is, raw material gases for the formation a RF-i-layer are introduced into the deposition chamber 418 through the gas supply pipe 449 while operating the mass flow controllers 456–460 and the cut-off valves 462–465 and 450–455. The gas pressure in the deposition chamber 418 is controlled to and maintained at a desired pressure suitable for the formation of the RF-i-layer. A RF power source (not shown in the figure) is switched on to apply a desired RF power through the bias voltage applying electrode 428 into the deposition chamber 418, wherein film formation is conducted for a desired period of time to form a RF-i-layer having a desired thickness on the previously formed n- or p-type layer. The application of the RF power is terminated, and the introduction of the raw material gases for the formation of the RF-i-layer is suspended. The deposition chamber 418 is evacuated to a vacuum of about $1\times10^{-6}$ Torr by means of the turbo-molecular pump. The formation of the MW-i-layer is conducted in the following manner. That is, the substrate is maintained at a desired temperature suitable for the formation of a MW-i-layer. Raw material gases for the formation a Mw-i-layer are introduced into the deposition chamber 418 through the gas supply pipe 449 while operating the mass flow controllers 455–460 and the cut-off valves 462–465 and 451–455. The gas pressure in the deposition chamber 418 is controlled to and maintained at a desired pressure suitable for the formation of the MW-i-layer. A microwave power source (not shown in the figure) is switched on to apply a desired microwave power through the waveguide 426 and the microwave introducing window 425 into the deposition chamber 418, wherein a DC voltage from the bias power source 424 is applied to the bias electrode 428 and the shutter 427 is opened, whereby film formation is conducted for a desired period of time to form a MW-i-layer having a desired thickness on the previously formed RF-i-layer. In this film formation, the spatial distribution of the bias power is adjusted to be in a desirable state by moving the bias electrode up and down and also right and left. Further, it is desirable to vary the bias power applied during the film formation. Further it is also desirable to vary the microwave power applied during the film formation. As for the raw material gases used, specifically, chlorine-containing raw material gas, and also silicon-containing raw material gas or germanium-containing raw material gas are used. It is desired to adjust their flow rates by means of the corresponding mass flow controllers in accordance with previously determined respective gas flow variation patterns during the film formation. In this case, it is desired that the inside of the deposition chamber is made to be constant at a desired vacuum degree by properly adjusting the exhaust system.

Now, after the formation of the MW-i-layer, the shutter 427 is closed, and the application of the microwave power and the application of the bias power are terminated. The deposition chamber 418 is evacuated to a vacuum of about $1\times10^{-6}$ Torr by means of the turbo-molecular pump. The formation of the second RF-i-layer on the MW-i-layer is conducted in the deposition chamber 418 in the following manner. That is, raw material gases for the formation of a RF-i-layer are introduced into the deposition chamber 418 through the gas supply pipe 449 while operating the mass flow controllers 456–460 and the cut-off valves 462–465 and 450–455. The gas pressure in the deposition chamber 418 is controlled to and maintained at a desired pressure suitable for the formation of the RF-i-layer. A RF power source (not shown in the figure) is switched on to apply a desired RF power through the bias voltage applying electrode 428 into the deposition chamber 418, wherein film formation is conducted for a desired period of time to form a RF-i-layer having a desired thickness on the previously formed n- or p-type layer. The application of the RF power is terminated, and the introduction of the raw material gases for the formation of the RF-i-layer is terminated. The deposition chamber 418 is evacuated to a vacuum of about $1\times10^{-6}$ Torr by means of the turbo-molecular pump. The substrate heating mechanism 411 is lifted, the gate valve 408 is opened, and the substrate holder is transferred into the transportation chamber 404. Thereafter, the gate valve 408 is closed. The substrate on the substrate holder 490 is moved below the substrate heating mechanism 412 and the substrate heating mechanism is lowered so that the substrate on the substrate holder 490 is positioned in the deposition chamber 419, wherein the gas pressure is controlled to a pressure substantially equivalent to a given gas pressure employed upon film formation by flowing hydrogen gas, and the substrate is heated to and maintained at a desired temperature by the substrate heating mechanism 412. Then the formation of a p- or n-type layer is conducted in the deposition chamber 419. Raw material gases for the formation a p- or n-type layer are introduced into the deposition chamber 419 through the gas supply pipe 469 while operating the mass flow controllers 476–479 and the cut-off valves 481–484 and 470–474. The gas pressure in the deposition chamber 419 is controlled to and maintained at a desired pressure suitable for the formation of the p- or n-type layer. The RF power source 423 is switched on to apply a desired RF power through the RF power supply cup 421 into the deposition chamber 419, wherein film formation is conducted for a desired period of time to form a p- or n-type layer having a desired thickness on the previously formed RF-i-layer. After this, the application of the RF power is terminated, and the introduction of the raw material gases is terminated.

Thus, there can be formed a pin junction structure cell for a photovoltaic device according to the present invention. In the case of producing a photovoltaic device having a semiconductor active region comprising a plurality of pin junction structure cells according to the present invention, such semiconductor active region can be formed by repeating the above procedures.

Shown in FIG. 8 is a multichambered roll-to-roll type film-forming apparatus suitable for continuously forming a photovoltaic device according to the present invention on a substrate web. The film-forming apparatus shown in FIG. 8 comprises a load chamber 5010 for the introduction of a substrate web into the system, an exhaust pipe 5011, a vacuum pump 5012, a gas gate 5201, a gas supply pipe 5301 for the introduction of a gate gas into the gas gate 5201, a first n-type layer-forming chamber 5020, an exhaust pipe 5021, a vacuum pump 5022, a RF power supplying coaxial cable 5023, a RF power source 5024, a raw material gas feed pipe 5025, a mixing device 5026 for raw material gases to be supplied, a gas gate 5202, a gas supply pipe 5302 for the introduction of a gate gas into the gas gate 5202, a first RF-i layer-forming chamber 5030, an exhaust pipe 5031, a vacuum pump 5032, a RF power supplying coaxial cable 5033, a RF power source 5034, a raw material gas feed pipe 5035, a mixing device 5036 for raw material gases to be supplied, a gas gate 5203, a gas supply pipe 5303 for the introduction of a gate gas into the gas gate 5203, a first MW-i layer-forming chamber 5040, an exhaust pipe 5041, a vacuum pump 5042 (including a diffusion pump), a microwave introducing waveguide 5043, a microwave power source 5044, a raw material gas feed pipe 5045, a mixing device 5046 for raw material gases to be supplied, a gas gate 5204, a gas supply pipe 5304 for the introduction of a gate gas into the gas gate 5204, a first RF-i layer forming chamber 5050, an exhaust pipe 5051, a vacuum pump 5052, a RF power supplying coaxial cable 5053, a RF power source 5054, a raw material gas feed pipe 5055, a mixing device 5056 for raw material gases to be supplied, a gas gate 5205, a gas supply pipe 5305 for the introduction of a gate gas into the gas gate 5205, a first p-type layer forming chamber 5060, an exhaust pipe 5061, a vacuum pump 5062, a RF power supplying coaxial cable 5063, a RF power source 5064, a raw material gas feed pipe 5065, a mixing device 5066 for raw material gases to be supplied, a gas gate 5206, a gas supply pipe 5306 for the introduction of a gate gas into the gas gate 5206, a second n-type layer-forming chamber 5070, an exhaust pipe 5071, a vacuum pump 5072, a RF power supplying coaxial cable 5073, a RF power source 5074, a raw material gas feed pipe 5075, a mixing device 5076 for raw material gases to be supplied, a gas gate 5207, a gas supply pipe 5307 for the introduction of a gate gas into the gas gate 5207, a second RF-i layer-forming chamber 5070, an exhaust pipe 5071, a vacuum pump 5072, a RF power supplying coaxial cable 5073, a RF power source 5074, a raw material gas feed pipe 5075, a mixing device 5037 for raw material gases to be supplied, a gas gate 5208, a gas supply pipe 5308 for the introduction of a gate gas into the gas gate 5208, a second MW-i layer-forming chamber 5090, an exhaust pipe 5091, a vacuum pump 5092 (including a diffusion pump), a microwave introducing waveguide 5093, a microwave power source 5094, a raw material gas feed pipe 5095, a mixing device 5096 for raw material gases to be supplied, a gas gate 5209, a gas supply pipe 5309 for the introduction of a gate gas into the gas gate 5209, a second RF-i layer-forming chamber 5100, an exhaust pipe 5101, a vacuum pump 5102, a RF power supplying coaxial cable 5103, a RF power source 5104, a raw material gas feed pipe 5105, a mixing device 5106 for raw material gases to be supplied, a gas gate 5210, a gas supply pipe 5310 for the introduction of a gate gas into the gas gate 5210, a second p-type layer-forming chamber 5110, an exhaust pipe 5111, a vacuum pump 5112, a RF power supplying coaxial cable 5113, a RF power source 5114, a raw material gas feed pipe 5115, a mixing device 5116 for raw material gases to be supplied, a gas gate 5211, a gas supply pipe 5311 for the introduction of a gate gas into the gas gate 5211, a third n-type layer-forming chamber 5120, an exhaust pipe 5121, a vacuum pump 5122, a RF power supplying coaxial cable 5123, a RF power source 5124, a raw material gas feed pipe 5125, a mixing device 5126 for raw material gases to be supplied, a gas gate 5212, a gas supply pipe 5312 for the introduction of a gate gas into the gas gate 5212, a third RF-i layer-forming chamber 5130, an exhaust pipe 5131, a vacuum pump 5132, a RF power supplying coaxial cable 5133, a RF power source 5134, a raw material gas feed pipe 5135, a mixing device 5136 for raw material gases to be supplied, a gas gate 5213, a gas supply pipe 5313 for the introduction of a gate gas into the gas gate 5213, a third p-type layer-forming chamber 5140, an exhaust pipe 5141, a vacuum pump 5142, a RF power supplying coaxial cable 5143, a RF power source 5144, a raw material gas feed pipe 5145, a mixing device 5146 for raw material gases to be supplied, a gas gate 5214, a gas supply pipe 5314 for the introduction of a gate gas into the gas gate 5214, an unload chamber 5150, an exhaust pipe 5151, and a vacuum pump 5152.

In addition, each of the MW-i layer-forming chambers in the film-forming apparatus shown in FIG. 8 is also provided with a coaxial cable and a power source for applying a bias voltage (these are not shown in the figure).

The production of a photovoltaic device according to the present invention using the film-forming apparatus is conducted, for example, in the following manner.

Firstly, there is provided a stainless steel web as a substrate. On the stainless steel web, there are formed a reflection layer comprising, for example, Ag or Al—Si and a reflection promotion layer comprising, for example, ZnO, using a conventional film-forming technique.

The stainless steel web having the reflection layer and reflection promotion layer thereon (this will be hereinafter referred to as substrate web 5401) is wound on a reel 5400. The reel 5400 having the substrate web 5401 wound thereon is set in the load chamber 5010, and it is paid out from the reel, passes through all the gates and chambers, and is fixed to a take-up reel 5402 in the unload chamber 5150. Then, the respective chambers are evacuated to a vacuum of less than $10^{-3}$ Torr. Hydrogen gas is introduced into the respective film-forming chambers through the respective mixing devices. In addition, hydrogen gas is also supplied into the respective gas gates. The flow rate of the hydrogen gas supplied into each gas gate is controlled so that raw material gases used in each adjacent film-forming chamber are not mixed with each other. The flow rate of the hydrogen gas supplied into each gas gate is preferably determined depending upon the interval during which the substrate web passes therethrough. In a specific example, when the interval is 0.5 to 5 mm, the flow rate of the hydrogen gas is desired to be 200 to 3000 sccm. The substrate web 5401 situated in each film-forming chamber is heated to and maintained at a desired temperature by means of an electric heater (not shown in the figure). Thereafter, the hydrogen gas introduced into each film-forming chamber is replaced by appropriate film-forming raw material gases. The inside of each film-forming chamber is controlled to and maintained at a desired vacuum degree by operating the exhaust system. The substrate web is moved as desired. A desired high frequency (RF) power or a desired microwave (MW) power is applied to the corresponding film-forming chamber, whereby there is formed a plasma causing the formation of a deposited film on the substrate web 5401. In this way, a photovoltaic element with triple cells each having a pin junction structure is continuously formed on the entirety of the substrate web. Thereafter, the resultant is taken out from the system, and a transparent electrode and a collecting electrode are then formed thereon in the conventional manner. Thus, there is obtained a photovoltaic device.

Figure 9:
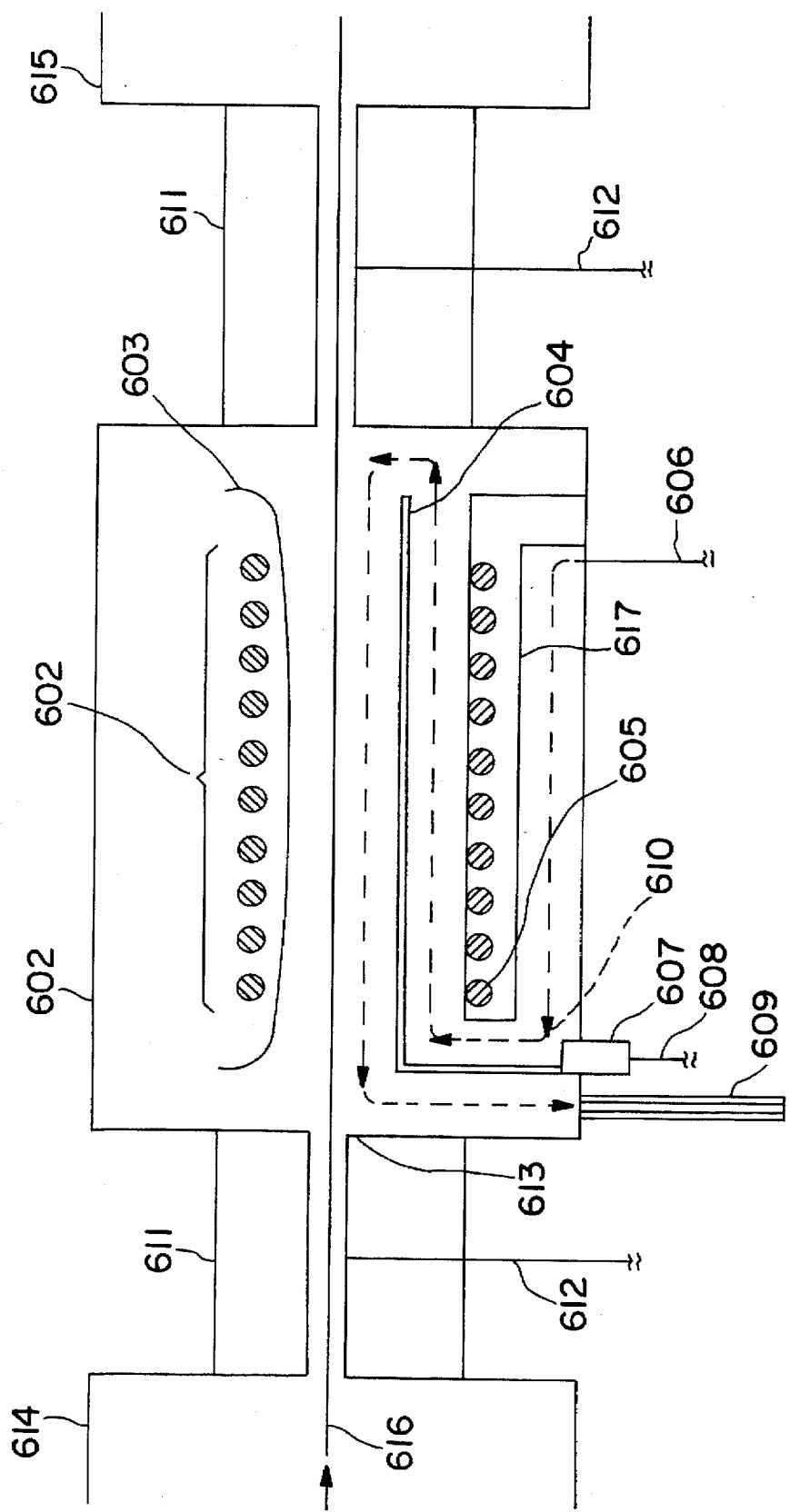
FIG. 9 is a schematic diagram of an example of a RF plasma CVD chamber suitable for use in the roll-to-roll type film-forming apparatus shown in FIG. 8.

FIG. 9 is a schematic diagram of each RF plasma CVD film-forming chamber for forming a RF-i layer in the roll-to-roll type film-forming apparatus shown in FIG. 8.

In FIG. 9, reference numeral 601 indicates a RF plasma CVD film-forming chamber. One side of the RF plasma CVD film-forming chamber 601 is communicated with an other film-forming chamber 614 through a gas gate 611 so that a substrate web 616 can be transported between the two chambers. Reference numeral 612 indicates a gas supply pipe for a gate gas. The other side of the RF plasma CVD film-forming chamber 601 is communicated with a further film-forming chamber 615 through a gas gate 611 so that the substrate web 616 can be transported between the two chambers. The RF plasma CVD film-forming chamber 601 comprises a lamp heater mechanism 602 for the substrate web 616, a control board 603 for controlling the substrate web so as to have a desired temperature distribution, a RF power applying electrode 604, a pre-heating mechanism 605 for a raw material gas, a raw material gas feed pipe 606 (the raw material gas flows in the direction shown by arrow 610), an insulator 607, a RF power supplying coaxial cable 608, an exhaust pipe 609, and a control plate 613 for controlling the interval of the gas gate. In this RF plasma CVD film-forming chamber, a raw material gas (that is, silane gas)

introduced thereinto through the gas feed pipe 606 is heated by means of the preheating mechanism 605 while flowing in the direction shown by the arrow 610. During this time, the raw material gas is contacted with the wall surface of the pre-heating mechanism, wherein should the raw material gas contain a contaminant, the contaminant reacts with the raw material gas (the silane gas) to deposit on the wall surface of the preheating mechanism, thereby decreasing the content of said contaminant and, as a result, there can be formed a high quality deposited film. Further, the preheating activates the raw material gas and because of this, the deposition of a film can be conducted with a relatively low RF power. This situation is advantageous in that the previously formed layer is prevented from suffering plasma damage and occurrence of an interfacial level between the two layers involved.

The film formation in the RF plasma CVD film-forming chamber is desirably carried out at a gas temperature in the range of 150° C. to 450° C.

The lamp heater mechanism 602 is usually arranged in the RF plasma CVD film-forming chamber 601 such that the substrate temperature becomes uniform in the film-forming chamber. However, it is possible for the lamp heater mechanism to be arranged such that the substrate temperature upon forming the RF-i-type layer is varied so as to decrease toward the n- or p-type layer.

The RF plasma CVD film-forming chamber desirably has a cooling mechanism for cooling the circumferential wall of the film-forming chamber, wherein a cooling medium such as water is recycled through the cooling mechanism. In this case, release of gas from the inner face of the circumferential wall of the film-forming chamber is prevented upon film formation, whereby contamination of such release gas into the deposited film is prevented. The circumferential wall of the film-forming chamber is desirably maintained at a temperature of 50° C. or less during film formation.

Figure 10:
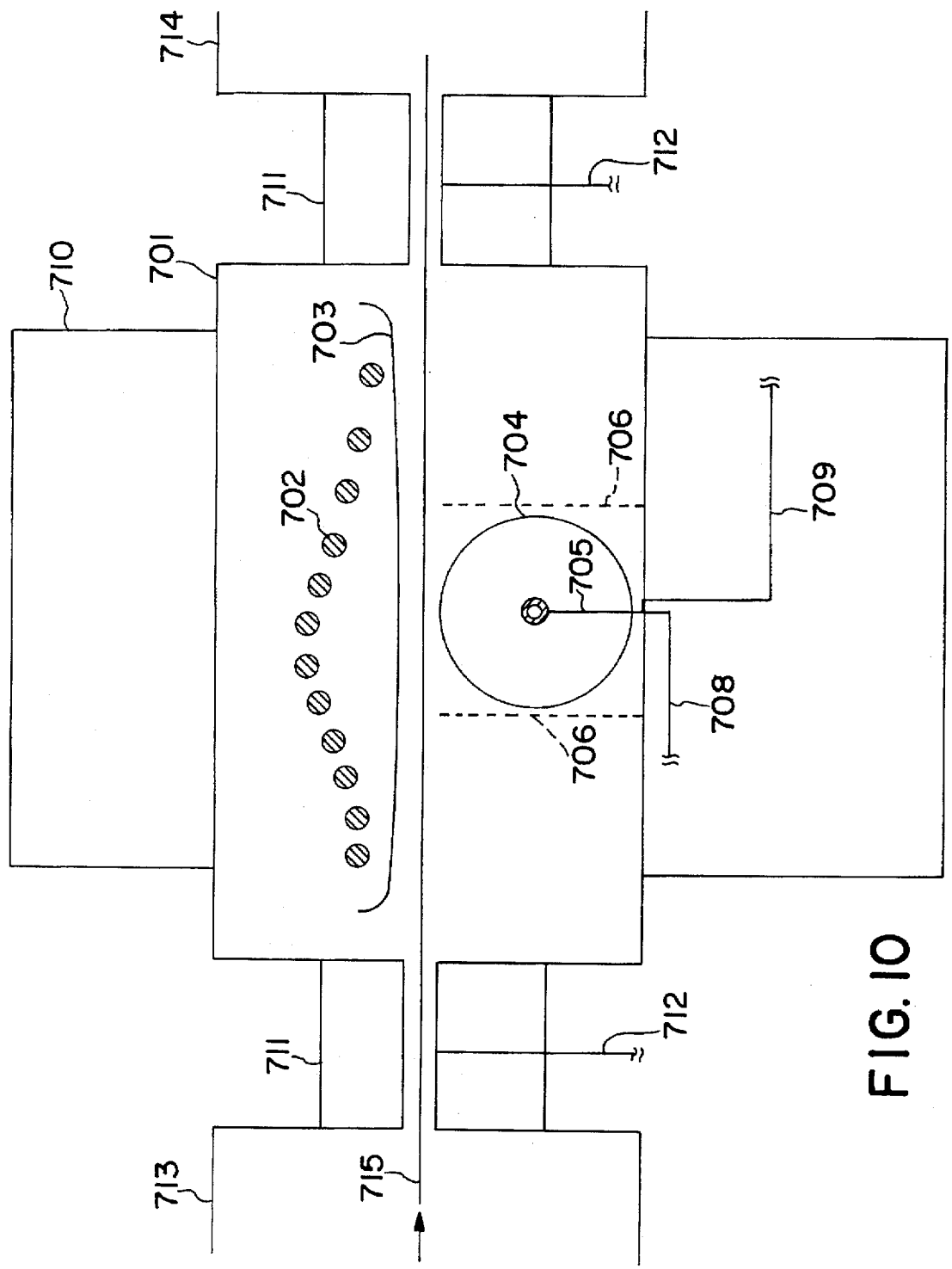
FIG. 10 is a schematic diagram of an example of a MW plasma CVD chamber suitable for use in the roll-to-roll type film-forming apparatus shown in FIG. 8.

FIG. 10 is a schematic diagram of each MW plasma CVD film-forming chamber for forming a MW-i layer in the roll-to-roll type film-forming apparatus shown in FIG. 8.

In FIG. 10, reference numeral 701 indicates a MW plasma CVD film-forming chamber. One side of the MW plasma CVD film-forming chamber 701 is communicated with an other film-forming chamber 713 through a gas gate 711 so a substrate web 715 can be transported between the two chambers. Reference numeral 712 indicates a gas supply pipe for a gate gas. The other side of the MW plasma CVD film-forming chamber 701 is communicated with a further film-forming chamber 714 through a gas gate 711 so that the substrate web 715 can be transported between the two chambers. The MW plasma CVD film-forming chamber 701 comprises a lamp heater mechanism 702 for the substrate web 715, a control board 703 for controlling the substrate web so as to have a desired temperature distribution, a microwave introducing window 704, a bias electrode 705 for applying a bias voltage, a mesh member 706 for controlling the microwave discharging region, a bias voltage applying cable 708, a raw material gas feed pipe 709, and a diffusion pump 710. In addition, the MW plasma CVD film-forming chamber 701 is provided with a bias power source, a mechanical booster pump, a rotary pump, and the like (not shown in the figure).

The lamp heater mechanism 702 is necessary to be arranged in the MW plasma CVD film-forming chamber so that the entire of the substrate web situated in the film-forming chamber can be maintained at a desired temperature. For this purpose, the lamp heater mechanism 702 is desirably arranged in a mountain-like form as shown in FIG. 10.

The MW plasma CVD film-forming chamber is desired to have a cooling mechanism for cooling the circumferential wall of the film-forming chamber, wherein a cooling medium such as water is recycled through the cooling mechanism. In this case, release of gas from the inner face of the circumferential wall of the film-forming chamber is prevented upon film formation, whereby contamination of released gas into the deposited film is prevented. The circumferential wall of the film-forming chamber is desirably maintained at a temperature of 50° C. or less during film formation.

In the following, the present invention will be described in more detail with reference to the following examples, which are provided for illustrative purposes only, and are not intended to limit the scope of the invention.

EXAMPLE 1

Using the apparatus shown in FIG. 7A, there were prepared eight single cell type photovoltaic devices (samples No. 1-1 to No. 1-8) of the configuration shown in FIG. 4 under the conditions shown in Table 1, wherein in each case, the flow rate of $SiH_2Cl_2$ was changed as shown in Table 2.

As the substrate 190 of the photovoltaic device, there was provided a stainless steel plate (SUS 430 under the JIS standard) of 0.125 mm in thickness having a 4500 Å thick Ag film as a reflection layer 101 and a 1 um thick ZnO film with a textured surface as a reflection promotion layer 102 formed thereon.

Each photovoltaic device sample was prepared in the following manner. That is, each of the transportation chambers and deposition chambers were evacuated to about $1\times10^{-6}$ Torr. The substrate was positioned on the substrate holder 490, and the substrate holder was introduced into the load lock chamber 401. The load lock chamber 401 was evacuated to about $1\times10^{-3}$ Torr by operating the mechanical booster pump and rotary pump (not shown), followed by evacuating to about $1\times10^{31\ 6}$ Torr by operating the turbo-molecular pump (not shown). The gate valve 406 was opened, the substrate holder 490 was transferred into the transportation chamber 402, and the gate valve 406 was closed. The substrate on the substrate holder 490 was moved below the substrate heating mechanism 410 and the substrate heating mechanism was lowered so that the substrate on the substrate holder 490 was positioned in the deposition chamber 417, wherein the gas pressure was controlled to a pressure substantially equivalent to a given gas pressure employed upon film formation by flowing hydrogen gas, and the substrate was heated to and maintained at 300° C. by means of the substrate heating mechanism 410. Then, an n-type layer 103 was formed on the reflection promotion layer 102 of the substrate in the deposition chamber 417 under the n-type layer-forming conditions shown in Table 1, wherein the raw material gases were introduced into the deposition chamber 417, the gas pressure in the deposition chamber 417 was controlled to and maintained at 1.35 Torr, then a RF power of 1.8 W was applied into the deposition chamber 417, whereby a 400 Å thick n-type a-Si:H:P film as the n-type layer 103 was formed on the substrate. After this, the application of the RF power was terminated, and the introduction of the raw material gases was terminated. Then, the deposition chamber 417 was evacuated to a vacuum degree of about $1\times10^{-6}$ Torr by operating the turbo-molecular pump. The substrate heating mechanism 410 was lifted, the gate valve 407 was opened, and the substrate holder was transferred into the transportation chamber 403. Thereafter, the gate valve 407 was closed. The substrate on the substrate holder 490 was moved below the substrate heating mechanism 411 and the substrate heating mechanism was lowered so that the substrate on the substrate holder 490 was positioned in the deposition chamber 418, wherein the gas pressure was controlled to a pressure substantially equivalent to a given gas pressure employed upon film formation by flowing hydrogen gas, and the substrate was heated to and maintained at 300° C. by the means of the substrate heating mechanism 411. Then, a RF-i-layer 151 was formed on the n-type layer in the deposition chamber 418 under the RF-i layer-forming conditions shown in Table 1, wherein the raw material gases were introduced into the deposition chamber 418, the gas pressure in the deposition chamber 418 was controlled to and maintained at 0.5 Torr, then a RF power of 2 W was applied into the deposition chamber 418, whereby a 100 Å thick a-Si:H film as the RF-i-type layer 151 was formed on the n-type layer. After this, the application of the RF power was terminated, and the introduction of the raw material gases for the formation of the RF-i-layer was suspended, while maintaining the substrate at 300° C. The deposition chamber 418 was evacuated to about $1 \times 10^{-6}$ Torr by means of the turbo-molecular pump. Then, a MW-i-type layer 104 was formed in the deposition chamber 418 under the MW-i layer-forming conditions shown in Table 1 and using $SiH_2Cl_2$ under a given flow rate condition shown in Table 2, wherein the material gases were introduced into the deposition chamber 418, the gas pressure in the deposition chamber 418 was controlled to and maintained at 7 mTorr, a MW power of 220 W was applied into the deposition chamber 418, and simultaneously a RF bias power of 700 W was applied into the deposition chamber 418 while opening the shutter 427, whereby a 700 Å thick a-SiGe:H film as the MW-i-type layer 104 was formed on the RF-i-type layer 151. After the formation of the MW-i-layer, the shutter 427 was closed. The application of the microwave power and the application of the bias power are terminated. And the introduction of the raw material gases then was suspended. The deposition chamber 418 was then evacuated to about $1 \times 10^{-6}$ Torr by means of the turbo-molecular pump. A further RF-i-layer 161 was formed on the MW-i-layer 104 in the deposition chamber 418 under the RF-i layer-forming conditions shown in Table 1, wherein the raw material gases were introduced into the deposition chamber 418, the gas pressure in the deposition chamber 418 was controlled to and maintained at 0.5 Torr, then a RF power of 2 W was applied into the deposition chamber 418, whereby a 200 Å thick a-Si:H film as the RF-i-type layer 161 was formed on the MW-i-type layer. After this, the application of the RF power was terminated, and the introduction of the raw material gases was terminated. The deposition chamber 418 was evacuated to about $1 \times 10^{-6}$ Torr by means of the turbo-molecular pump. The substrate heating mechanism 411 was lifted, the gate valve 408 was opened, and the substrate holder was transferred into the transportation chamber 404. Thereafter, the gate valve 408 was closed. The substrate on the substrate holder 490 was moved below the substrate heating mechanism 412 and the substrate heating mechanism was lowered so that the substrate on the substrate holder 490 was positioned in the deposition chamber 419, wherein the gas pressure was controlled to a pressure substantially equivalent to a given gas pressure employed upon film formation by flowing hydrogen gas, and the substrate was heated to and maintained at 300° C. by means of the substrate heating mechanism 412. Then, a p-type layer 105 was formed on the RF-i-type layer 161 under the p-type layer-forming conditions shown in Table 1, wherein the raw material gases were introduced into the deposition chamber 419, the gas pressure in the deposition chamber 419 was controlled to and maintained at 2 Torr, then a RF power of 42 W was applied into the deposition chamber 419, whereby a 200 Å thick µc-Si:H:B film as the p-type layer 105 was formed on the RF-i-type layer 161.

Thereafter, the application of the RF power and the introduction of the raw material gases were terminated, and the substrate having a stacked body with a pin junction structure thereon was taken out from the fabrication apparatus. Then, on the p-type layer of the stacked body, there was formed a 700 Å thick $In_2O_3$ thin film as a transparent electrode 112 by means of a conventional reactive vacuum evaporation process, followed by forming a collecting electrode 113 comprising Cr (of 1000 Å in thickness)/Ag (of 10000 Å thickness)/Cr (of 1000 Å thickness) by means of a conventional vacuum evaporation process.

The above procedures were repeated eight times, except that the flow rate of the $SiH_2Cl_2$ used as a chlorine atom-supplying source in the formation of the MW-i-type layer was changed as shown in each case, to thereby form eight photovoltaic device samples Nos. 1-1 to 1-8. For each photovoltaic device sample, a plurality of samples were prepared for evaluation purposes.

Evaluation

For each of the resultant photovoltaic device samples Nos. 1-1 to 1-8, evaluation was conducted with respect to (i) initial photoelectric conversion efficiency, (ii) degradation in the initial photoelectric conversion efficiency after exposure to light irradiation over a long period of time (hereinafter referred to as light degradation), (iii) environmental resistance, and (iv) density of states. The results obtained are collectively shown in Table 3.

The evaluation of each of the above evaluation items (i) to (iv) was conducted in the following manner.

(i) Evaluation of the initial photoelectric conversion:

This evaluation is conducted by determining the initial photoelectric conversion efficiency of the photovoltaic device sample when the photovoltaic device sample is subjected to irradiation of pseudo sunlight (AM 1.5 light) of 100 mW/cm² in intensity while maintaining the photovoltaic device sample at 25° C.

(ii) Evaluation of the light degradation:

This evaluation is conducted by examining (a) the initial photoelectric conversion efficiency when the photovoltaic device sample is subjected to irradiation of pseudo sunlight (AM 1.5 light) of 100 mW/cm² in intensity while maintaining the photovoltaic device sample at 25° C., subjecting the photovoltaic device sample to irradiation of pseudo sunlight (AM 1.5 light) of 100 mW/cm² in intensity while maintaining the photovoltaic device sample at 50° C. for 1000 hours, determining (b) the photoelectric conversion efficiency of the photovoltaic device sample thus treated when it is subjected to irradiation of pseudo sunlight (AM 1.5 light) of 100 mW/cm² in intensity while maintaining the photovoltaic device sample at 25° C., and obtaining the change between the photoelectric conversion efficiencies (a) and (b).

(iii) Evaluation of the environmental resistance:

This evaluation is conducted by determining (a) an initial photoelectric conversion efficiency when the photovoltaic device sample is subjected to irradiation of pseudo sunlight (AM 1.5 light) of 100 mW/cm² in intensity while maintaining the photovoltaic device sample at 25° C., allowing the photovoltaic device sample to stand in the dark at 80° C. and 80% humidity for 100 hours, determining (b) the photoelectric conversion efficiency of the photovoltaic device sample thus treated when it is subjected to irradiation of pseudo sunlight (AM 1.5 light) of 100 mw/cm$^2$ in intensity while maintaining the photovoltaic device sample at 25° C., and obtaining the change between the photoelectric conversion efficiencies (a) and (b).

(iv) Evaluation of the density of state:

This is conducted by measuring the density of states of the multilayered i-type semiconductor layer of the photovoltaic sample in accordance with the known CPM method (the constant photocurrent method) (see, "Direct Measurement of the Gap States and Band Tail Absorption by Constant Photocurrent Method in Amorphous Silicon", M. Vanecek, et al, *Solid State Communications*, vol. 39, 1981, pp. 1199–1202).

From the results shown in Table 3, it is understood that each of the photovoltaic devices obtained by using the chlorine-containing raw material (that is, $SiH_2Cl_2$) in an amount of less than 10% of the total amount of the chlorine-free raw materials (that is, $SiH_4$ and $GeH_4$) and said chlorine-containing raw material for the formation of the MW-i-type layer clearly excels in photovoltaic characteristics.

EXAMPLE 2

The procedures of Example 1 were repeated, except that the conditions of Table 1 were changed to those shown in Table 4 including hydrogen plasma treatment conducted before the formation of the p-type layer and the conditions shown in Table 2 were changed to those shown in Table 5, to thereby obtain eight photovoltaic device samples Nos. 2-1 to 2-8.

Each of the resultant photovoltaic device samples was evaluated with respect to initial photoelectric conversion efficiency, light degradation, environmental resistance, and density of states in the same manner as in Example 1.

The results obtained are collectively shown in Table 6.

From the results shown in Table 6, it is understood that each of the photovoltaic devices obtained by using the chlorine-containing raw material (that is, $SiH_2Cl_2$) in an amount of less than 10% of the total amount of the chlorine-free raw material (that is, $SiH_4$) and said chlorine-containing raw material for the formation of the MW-i-type layer clearly excels in photovoltaic characteristics.

EXAMPLE 3

There were prepared fourteen photovoltaic device samples Nos. 3-1 to 3-14 by repeating the procedures for the preparation of the photovoltaic device sample No. 1-5 in Example 1, except for using $B_2H_6$ as a doping raw material at a different flow rate as shown in Table 7 during formation of the MW-i-type layer in each case.

Each of the resultant photovoltaic device samples was evaluated with respect to initial photoelectric conversion efficiency, light degradation, environmental resistance, and density of states in the same manner as in Example 1.

The results obtained are collectively shown in Table 8.

From the results shown in Table 8, it is understood that each of the photovoltaic devices obtained by using the doping raw material in an amount of 0.01 to 30 ppm during the formation of the MW-i-type layer clearly excels in photovoltaic characteristics.

EXAMPLE 4

There were prepared seven photovoltaic device samples Nos. 4-1 to 4-7 by repeating the procedures for the preparation of the photovoltaic device samples No. 1-4 in Example 1, except for using $PH_3$ as a doping raw material and $BF_3$ as a further doping raw material respectively at a different flow rate as shown in Table 9 during the formation of the MW-i-type layer in each case.

Each of the resultant photovoltaic device samples was evaluated with respect to initial photoelectric conversion efficiency, light degradation, environmental resistance, and density of states in the same manner as in Example 1.

The results obtained are collectively shown in Table 10.

From the results shown in Table 10, it is understood that each of the photovoltaic devices obtained by using the $PH_3$ in an amount of 10 to 500 ppm during the formation of the MW-i-type layer clearly excels in photovoltaic characteristics.

EXAMPLE 5

(1). There was prepared a pin junction photovoltaic device (hereinafter referred to as "device sample A") by repeating the procedures of Example 1 except for changing the conditions shown in Table 1 employed in Example 1 to those shown in Table 11, wherein as the substrate 190, there was used a 0.125 mm thick SUS 430 stainless steel plate having a surface provided with irregularities of 500 Å to 2000 Å in height and having a 4500 Å thick Ag film as a reflection layer 101 and a 1 um thick ZnO film with a textured surface as a reflection promotion layer 102 formed thereon, and the amount of the chlorine-containing raw material (that is, $SiH_2Cl_2$) used during the formation of a MW-i-type layer was varied as described in Table 11.

(2). The procedures for preparing the above device sample A were repeated, except that the amount of the $SiH_2Cl_2$ was made constant at 2 sccm without having been varied, to thereby obtain a comparative pin junction photovoltaic device (hereinafter referred to as "device sample B").

For each of the device samples A and B, evaluation was conducted with respect to initial photoelectric conversion efficiency and light degradation (that is, photoelectric conversion efficiency after having been exposed to light irradiation in a high temperature atmosphere) in the same manner as in Example 1.

The obtained results revealed that the initial photoelectric conversion efficiency of the device sample A is as much as 1.05 times greater that of the device sample B and the light degradation of the device sample A is smaller, i.e. 0.95 that of the device sample B.

EXAMPLE 6

(1). Using the fabrication apparatus shown in FIG. 7A and in accordance with the manner of producing a pin junction photovoltaic device in Example 1, there was prepared a tandem cell type pin junction photovoltaic device of the configuration shown in FIG. 5 (hereinafter referred to as "device sample A") under the conditions shown in Table 12.

(2). The procedures for preparing the above device sample A were repeated, except that no chlorine-containing raw material (that is, $SiH_2Cl_2$) was used during the formation of the MW-i-type layer in each cell, to thereby obtain a comparative tandem cell type pin junction photovoltaic device (hereinafter referred to as "device sample B").

For each of the device samples A and B, evaluation was conducted with respect to light degradation (that is, photoelectric conversion efficiency after having been exposed to light irradiation in a high temperature atmosphere) in the same manner as in Example 1.

The obtained results revealed that the light degradation of the device sample A is smaller, i.e. 0.5 that of the device sample B.

EXAMPLE 7

(1). Using the fabrication apparatus shown in FIG. 7A and in accordance with the manner of producing a pin junction photovoltaic device in Example 1, there was prepared a triple cell type pin junction photovoltaic device of the configuration shown in FIG. 6 (hereinafter referred to as "device sample A") under the conditions shown in Table 13.

(2). The procedures for preparing the above device sample A were repeated, except that no chlorine-containing raw material (that is, $SiH_2Cl_2$) was used during the formation of the MW-i-type layer in each cell, to thereby obtain a comparative triple cell type pin junction photovoltaic device (hereinafter referred to as "device sample B").

For each of the device samples A and B, evaluation was conducted with respect to light degradation (that is, photoelectric conversion efficiency after having been exposed to light irradiation in a high temperature atmosphere) in the same manner as in Example 1.

The obtained results revealed that the light degradation of the device sample A is smaller, i.e. 0.4 that of the device sample B.

EXAMPLE 8

(1). Using the fabrication apparatus shown in FIG. 7A and in accordance with the manner of producing a pin junction photovoltaic device in Example 1, there was prepared a triple cell type pin junction photovoltaic device of the configuration shown in FIG. 6 (hereinafter referred to as "device sample A") under the conditions shown in Table 14.

(2). The procedures for preparing the above device sample A were repeated, except that no chlorine-containing raw material (that is, $SiH_2Cl_2$) was used during the formation of the MW-i-type layer in each cell, to thereby obtain a comparative triple cell type pin junction photovoltaic device (hereinafter referred to as "device sample B").

For each of the device samples A and B, evaluation was conducted with respect to light degradation (that is, photoelectric conversion efficiency after having been exposed to light irradiation in a high temperature atmosphere) in the same manner as in Example 1.

The obtained results revealed that the light degradation of the device sample A is smaller, i.e. 0.5 that of the device sample B.

EXAMPLE 9

(1). Using the roll-to-roll type fabrication apparatus shown in FIG. 8, there was prepared a triple cell type pin junction photovoltaic device of the configuration shown in FIG. 6 in accordance with the previously described procedures of producing a triple cell type pin junction photovoltaic device using said roll-to-roll fabrication apparatus under the conditions shown in Table 15, wherein a 0.125 mm thick SUS 430 stainless steel web of 30 cm in width and 100 m in length having a 4500 Å thick A g film as a reflection layer and a 1 um thick ZnO film as a reflection promotion layer thereon was used as the substrate web 5401.

From the resultant photovoltaic device, there were obtained a plurality of small sized photovoltaic device samples (hereinafter referred to as photovoltaic device samples A).

(2). The procedures of (1) above for preparing a triple cell type pin junction photovoltaic device were repeated, except that no chlorine-containing raw material (that is, $SiH_2Cl_2$) was used during the formation of the MW-i-type layer in each cell, to thereby obtain a comparative triple cell type pin junction photovoltaic device.

From the resultant photovoltaic device, there were obtained a plurality of small sized photovoltaic device samples (hereinafter referred to as photovoltaic device samples B).

For the photovoltaic device samples A and B, evaluation was conducted with respect to initial photoelectric conversion efficiency and light degradation in the same manner as in Example 1. As a result, each of the photovoltaic device samples A was found to be good enough in initial photoelectric conversion efficiency although there was a variation of a few percentage points among their initial photoelectric conversion efficiencies. And each of the photovoltaic device samples A was found to be very slight in light degradation. In comparison with the photovoltaic device samples B, it was found that the mean value of light degradation for the photovoltaic device samples A is smaller, i.e. 0.6 that of the photovoltaic device sample B.

EXAMPLE 10

(1). Using the fabrication apparatus shown in FIG. 7A and in accordance with the manner of producing a pin junction photovoltaic device in Example 1, there was prepared a triple cell type pin junction photovoltaic device of the configuration shown in FIG. 6 (hereinafter referred to as "device sample A") under the conditions shown in Table 16.

(2). The procedures for preparing the above device sample A were repeated, except that no chlorine-containing raw material (that is, $SiH_2Cl_2$) was used during the formation of the MW-i-type layer in each cell, to thereby obtain a comparative triple cell type pin junction photovoltaic device (hereinafter referred to as "device sample B").

For each of the device samples A and B, evaluation was conducted with respect to initial photoelectric conversion efficiency and light degradation (that is, photoelectric conversion efficiency after having been exposed to light irradiation in a high temperature atmosphere) in the same manner as in Example 1.

The obtained results revealed that the initial photoelectric conversion efficiency of the device sample A is greater, as much as 1.05 times that of the device sample B and that the light degradation of the device sample A is smaller, as much as 0.5 that of the device sample B.

EXAMPLE 11

The photovoltaic device-producing procedures of each of device samples 1-2 to 1-7 were repeated except that the microwave power during the formation of the MW-i-type layer was changed from 220 W to 150 W and the flow rate of the $H_2$ gas during the formation of the MW-i-type layer was changed from 150 sccm to 300 sccm, to thereby obtain six single cell type photovoltaic devices.

Each of the resultant photovoltaic devices was evaluated with respect to initial photoelectric conversion efficiency, light degradation, environmental resistance, and density of states in the same manner as in Example 1.

As a result, each of the six photovoltaic devices was found to be satisfactory with regard to each evaluation item.

From the results obtained in the above examples, it is understood that the pin junction photovoltaic device according to the present invention, the i-type semiconductor layer of which is constituted by a three-layered structure comprising a specific non-single crystal MW-i-type layer interposed between a pair of non-single crystal RF-i-type layers each formed by means of the RF plasma CVD process, said MW-i-type layer having been formed from a mixture of a silane series gas not containing chlorine atom(s) (hereinafter referred to as chlorine-free silane series gas), a chlorine-containing raw material gas in an amount of 10% of the total amount of the chlorine-free silane series gas and the chlorine-containing raw material gas, and hydrogen gas by means of the microwave plasma discharge, surpasses the conventional pin junction type photovoltaic device in terms of light degradation. Further, the pin junction photovoltaic device excels in environmental resistance.

It is also understood that the light degradation of the pin junction photovoltaic device according to the present invention is improved by incorporating an element belonging to group III or V of periodic table into the MW-i-type layer.

Further, it is understood that the pin junction photovoltaic device according to the present invention is improved in terms of open circuit voltage, thereby improving the light degradation thereof.

TABLE 3

| No. | Initial photoelectric conversion efficiency* | environmental resistance | density of state | light degradation** |
|---|---|---|---|---|
| 1-1 | 1.00 | 0.65 | 1.0 | 0.60 |
| 1-2 | 1.10 | 0.85 | 0.90 | 0.95 |
| 1-3 | 1.05 | 0.90 | 0.85 | 0.90 |
| 1-4 | 1.00 | 0.92 | 0.85 | 0.95 |
| 1-5 | 1.10 | 0.95 | O.BG | 0.97 |
| 1-6 | 1.05 | 0.95 | 0.80 | 0.98 |
| 1-7 | 1.00 | C.96 | 0.90 | 0.96 |
| 1-8 | 0.90 | 0.72 | 1.20 | 0.70 |

*, **) relative values with the values for No. 1-1 being 1 respectively.

TABLE 1

| base member | stainless steel SUS430 (JIS standardl, thickness: 0.1 mm |
|---|---|
| substrate | SUS430/Ag 4500Å/ZnO 1 μm (texture structure) |
| n-type layer | $SiH_4$ 1 sccm, $H_2$ 48 sccm, $PH_2$ (diluted 1% with $H_2$) 0.5 sccm, pressure; 0.5 Torr, RF power: 1.8 W, substrate temperature: 300° C., thickness: 400Å |
| RF-i layer | $Si_2H_6$ 4 sccm, $H_2$ 100 sccm pressure: 0.5 Torr, RF power; 2 W, substrate temperature: 300° C., thickness: 100Å |
| MW-i layer | $SiH_4$ 40 sccm, $GeH_4$ 40 sccm, $H_2$ 150 sccm pressure: 7 mTorr, MW power: 220 W, RF bias power: 700 W substrate temperature: 300° C., thickness: 700Å |
| RF-i layer | $Si_2H$, 4 sccm, $H_2$ 100 sccm pressure: 6.5 Torr, RF power; 2 W, substrate temperature: 300° C., thickness: 200Å |
| p-type layer | $SiH_4$ (diluted 10% with $H_2$) 0.25 sccm, $H_2$ 34 sccm $B_2H_6$ (diluted 2% with $H_2$) 1 sccm pressure: 2 Torr, RF power: 42 W, substrate temperature: 300° C., thickness; 200Å |
| transparent electrode | $In_2O_3$, reactive vapor deposition method, 700Å |
| collecting electrode | Cr (1000Å)/Ag (10000Å)/Cr(1000Å) |

TABLE 2 flow rate of $SiH_2Cl_2$ applied during the MW-i layer deposition

| No. | 1-1 | 1-2 | 1-3 | 1-4 | 1-5 | 1-6 | 1-7 | 1-8 |
|---|---|---|---|---|---|---|---|---|
| flow rate | 0 | 0.1 | 0.5 | 1.0 | 2.0 | 5.0 | 8.0 | 10.0 (sccm) |

TABLE 4

| base member | stainless steel SUS430 (JIS standard), thickness: 0.125 mm |
|---|---|
| substrate | SUS430/AG 4500Å/ZnO 1 μm (specular structure) |
| n-type layer | $SiH_4$ 1 sccm, $H_2$ 48 sccm, $PH_2$ (diluted 1% with $H_2$) 0.5 sccm, pressure; 1.3 Torr, RF power; 1.8 W, substrate temperature: 360° C., thickness: 400Å |
| RF-i layer | $Si_2H_6$ 4 sccm, $H_2$ 100 sccm pressure: 0.5 Torr, RF power; 2 W, substrate temperature: 270° C., thickness: 100Å |
| MW-i layer | $SiH_4$ 80 sccm, $H_2$ 150 sccm presssure: 7 mTorr, MW power: 220 W, RF bias power: 700 W substrate temperature: 380° C., thickness: 700Å |
| RF-i layer | $Si_2H_6$ 4 sccm, $H_2$ 100 sccm |

TABLE 4-continued

| | |
|---|---|
| | pressurs: 0.5 Torr, RF power; 2 W, subsirate temperature: 270° C., thickness: 200Å |
| hydrogen plasma treatment | $H_2$ 100 sccm pressure: 0.5 Torr, RF power; 2 W, substrate temperature: 270° C. |
| p-type layer | $SiH_4$ (diluted 10% with $H_2$) 0.25 sccm, $H_2$ 34 sccm $B_2H_6$ (diluted 2% with $H_2$) 1 sccm pressure: 2 Torr, RF power: 42 W, substrate temperature: 200° C., thickness; 200Å |
| transparent electrode | $In_2O_3$, reactive vapor deposition method, 700Å |
| collecting electrode | Cr (1000 A)/Ag (10000Å)/Cr(1000Å) |

TABLE 5 flow rate of $SiH_2Cl_2$ applied during the MW-i layer deposition

| No. | 2-1 | 2-2 | 2-3 | 2-4 | 2-5 | 2-6 | 2-7 | 2.8 |
|---|---|---|---|---|---|---|---|---|
| flow rate | 0 | 0.1 | 0.5 | 1.0 | 2.0 | 5.0 | 8.0 | 10.0 (sccm) |

TABLE 6

| No. | Initial photoelectric conversion efficiency* | environmental resistance | density of state | light degradation** |
|---|---|---|---|---|
| 2-1 | 1.00 | 0.65 | 1.0 | 0.70 |
| 2-2 | 1.05 | 0.92 | 0.88 | 0.94 |
| 2-3 | 1.00 | 0.93 | 0.86 | 0.92 |
| 2-4 | 1.05 | 0.90 | 0.84 | 0.94 |
| 2-5 | 1.05 | 0.91 | 0.81 | 0.96 |
| 2-6 | 1.10 | 0.92 | 0.8 1 | 0.97 |
| 2-7 | 1.05 | 0.95 | 0.89 | 0.95 |
| 2.8 | 0.95 | 0.75 | 1.10 | 0.80 |

*, **) relative values with the values for No. 2-1 being 1 respectively.

TABLE 7 flow rate of $B_2H_6$ applied to the raw material gas during the MW-i layer deposition

| No. | 3-1 | 3-2 | 3-3 | 3-4 | 3-5 | 3-6 | 3-7 |
|---|---|---|---|---|---|---|---|
| $B_2H_6$ (ppm) | 0.001 | 0.01 | 0.1 | 0.5 | 1 | 2 | 5 |

| No. | 3-8 | 3-9 | 3-10 | 3-11 | 3-12 | 3-13 | 3-14 |
|---|---|---|---|---|---|---|---|
| $B_2H_6$ (ppm) | 10 | 15 | 20 | 25 | 30 | 35 | 40 |

TABLE 8

| No. | Initial photoelectric conversion efficiency* | environmental resistance | density of state | light degradation** |
|---|---|---|---|---|
| 3-1 | 1.00 | 0.65 | 1.0 | 0.70 |
| 3-2 | 1.10 | 0.92 | 0,88 | 0.94 |
| 3-3 | 1.05 | 0.93 | 0.86 | 0.92 |
| 3-4 | 1.04 | 0.91 | 0.84 | 0.94 |
| 3-5 | 1.06 | 0.91 | 0.81 | 0.96 |
| 3-6 | 1.09 | 0.92 | 0.81 | 0.97 |
| 3-7 | 1.10 | 0.95 | 0.89 | 0.95 |
| 3-8 | 1.11 | 0.95 | 0.90 | 0.96 |
| 3-9 | 1.10 | 0.93 | 0.89 | 0.92 |
| 3-10 | 1.10 | 0.91 | 0.90 | 0.96 |
| 3-11 | 1.09 | 0.95 | 0.89 | 0.96 |
| 3-12 | 1.07 | 0.94 | 0.90 | 0.94 |

TABLE 8-continued

| No. | Initial photoelectric conversion efficiency* | environmental resistance | density of state | light degradation** |
|---|---|---|---|---|
| 3-13 | 1.09 | 0.92 | 0.90 | 0.93 |
| 3-14 | 0.99 | U.76 | 0.99 | 0.69 |

*, **) relative values with the values for No. 3-1 being 1 respectively.

TABLE 9

| No. | 4-1 | 4-2 | 4-3 | 4-4 | 4-5 | 4-6 | 4-7 |
|---|---|---|---|---|---|---|---|
| $PH_3$ (ppm) | 0.001 | 11 | 50 | 100 | 300 | 500 | 600 |
| $PH_3$ (ppm) | 0.001 | 10 | 47 | 90 | 250 | 450 | 700 |

TABLE 10

| No. | Initial photoelectric conversion efficiency* | environmental resistance | density of state | light degradation** |
|---|---|---|---|---|
| 4-1 | 1.00 | 0.65 | 1.0 | 0.70 |
| 4-2 | 1.10 | 0.92 | 0.88 | 0.97 |
| 4-3 | 1.05 | 0.94 | 0.84 | 0.93 |
| 4-4 | 1.08 | 0.91 | 0.83 | 0.93 |
| 4-5 | 1.07 | 0.92 | 0.80 | 0.97 |
| 4-6 | 1.11 | 0.93 | 0.90 | 0.92 |
| 4-7 | 1.06 | 0.95 | 0.86 | 0.92 |
| 4-8 | 0.95 | 0.75 | 1.10 | 0.80 |

*, **) relative values with the values for No. 4-1 being 1 respectively.

TABLE 11

| | |
|---|---|
| base member | stainless steel SUS430 (JIS standard), thickness: 0.125 mm |
| substrate | SUS430/AG 4500Å/ZnO 1 μm (texture structure) |
| n-type layer | $SiH_4$ 1 sccm, $H_2$ 48 sccm, $PH_3$ (diluted 1% with $H_2$) 0.5 sccm<br>pressure; 1.3 Torr, RF power; 1.8 W, substrate temperature: 380° C., thickness: 400Å |
| RF-i layer | $Si_2H_6$ 4 sccm, $H_2$ 100 sccm<br>pressure: 0.5 Torr, RF power; 2 W, substrate temperature: 270° C., thickness: 100Å |
| MW-i layer | $SiH_4$ 40 sccm, $GeH_4$ 35 sccm, $H_2$ 150 sccm<br>$SiH_2Cl_2$ 0 sccm–2 sccm (varied in the layer thickness direction in the first 50Å)<br>2 sccm (in the middle 600Å)<br>2 sccm–0 sccm (varied in the layer thickness direction in the last 50Å)<br>pressure: 7 mTorr, MW power: 220 W, RF bias power 700 W substrate temperature: 380° C., thickness: 700Å |
| RF-i layer | $Si_2H_6$ 4 sccm, $H_2$ 100 sccm<br>pressure: 0.5 Torr, RF power; 2 W, substrate temperature: 270° C., thickness: 200Å |
| p-type layer | $SiH_4$ (diluted 10% with $H_2$) 0.25 sccm, $H_2$ 34 sccm<br>$B_2H_6$ (diluted 2% with $H_2$) 1 sccm<br>pressure: 2 Torr, RF power: 42 W, substrate temperature: 200° C., thickness; 200Å |

TABLE 12

| | |
|---|---|
| base member | stainless steel SUS430 (JIS standard), thickness: 0.125 mm |
| substrate<br>(bottom cell) | SUS430/AG 4500Å/ZnO 1 μm (texture structure) |
| n-type layer | $SiH_4$ 1 sccm, $H_2$ 48 sccm, $PH_3$ (diluted 1% with $H_2$) 0.5 sccm<br>pressure; 1.3 Torr, RF power, 1.8 W, substrate temperature: 380° C., thickness: 400Å |
| RF-i layer | $Si_2H_6$ 4 sccm, $H_2$ 100 sccm $B_2H_6$ 0.6 ppm<br>pressure: 0.5 Torr, RF power; 2 W, substrate temperature: 270° C., thickness: 100Å |
| MW-i layer | $SiH_4$ 40 sccm, $GeH_4$ 40 sccm, $SiH_2CL_2$ 2 sccm, $H_2$ 150 sccm<br>pressure: 7 mTorr, MW power 220 W, RF bias power: 700 W substrate temperature: 380° C., thickness: 700Å (deposition rate: 40 Å/sec) |
| RF-i layer | $Si_2H_6$ 4 sccm, $H_2$ 100 sccm<br>pressure: 0.5 Torr, RF power; 2 W, substrate temperature. 270° C., thickness: 200Å |
| p-type layer | $SiH_4$ (diluted 10% with $H_2$) 0.25 sccm, $H_2$ 34 sccm<br>$B_2H_6$ (diluted 2% with $H_2$) 1 sccm<br>pressure: 2 Torr, RF power: 42 W, substrate temperature: 200° C., thickness; 200Å |
| (top cell) | |
| n-type layer | $SiH_4$ 1 sccm, $H_2$ 48 sccm, $PH_3$ (diluted 1% with $H_2$) 1 sccm<br>pressure: 1.3 Torr, RF power: 1.8 W, substrate temperature: 380° C., thickness: 100Å |
| RF-i layer | $Si_2H_6$ 4 sccm, $H_2$ 100 sccm<br>pressure: 0.5 Torr, RF power: 2 W, substrate temperature: 250° C., thickness: 1200Å |
| p-type layer | $SiH_4$ (diluted 10% with $H_2$) 0.25 sccm, $H_2$ 34 sccm<br>$B_2H_6$ (diluted 2% with $H_2$) 1 sccm<br>pressure: 2 Torr, RF power: 42 W, substrate temperature: 200° C., thickness: 100Å |
| transparent electrode | $In_2O_3$, reactive vapor deposition method, 700Å |
| collecting electrode | Cr (1000Å)/Ag (10000Å)/Cr(1000Å) |

TABLE 13

| | |
|---|---|
| base member | stainless steel SUS430 (JIS standard), thickness: 0.125 mm |
| substrate<br>(bottom cell) | SUS430/AG 4500Å/ZnO 1 μm (texture structure) |
| n-type layer | $SiH_4$ 1 sccm, $H_2$ 48 sccm, $PH_3$ (ditutad 1% with $H_2$) 0.5 sccm<br>pressure; 1.3Torr, RF power; 1.8W, substrate temperature: 380° C., thickness: 400Å |
| RF-i layer | $Si_2H_6$ 4 sccm, $H_2$ 100 sccm<br>pressure: 0.5 Torr, RF power; 2 W, substrate temperature: 270° C., thickness: 100Å |
| MW-i layer | $SiH_4$ 40 sccm, $GeH_4$ 40 sccm, $SiH2Cl$, 2 sccm, $H_2$ 150 sccm, $B_2H_6$ 0.6 ppm<br>pressure: 7 mTorr, MW power: 220 W, RF bias power: 700 W substrate |

TABLE 13-continued

| | |
|---|---|
| | temperature: 380° C., thickness: 700Å |
| RF-i layer | $Si_2H_6$ 4 sccm, $H_2$ 100 sccm |
| | pressure: 0.5 Torr, RF power: 2 W, substrate temperature: 270° C., thickness: 200Å |
| p-type layer | $SiH_4$ (diluted 10% with $H_2$) 0.25 sccm, $H_2$ 34 sccm |
| | $B_2H_2$ (diluted 2% with $H_2$) 1 sccm |
| | pressure: 2 Torr, RF power: 42 W, substrate temperature: 200° C., thickness; 200Å |
| (middle cell) | |
| n-type layer | $SiH_4$ 1 sccm, $H_2$ 48 sccm, $PH_3$ (diluted 1% with $H_2$) 1 sccm |
| | pressure; 1.3 Torr, RF power; 1.8 W, substrate temperature: 380° C., thickness: 100Å |
| RF-i layer | $Si_2H_2$ 4 sccm, $H_2$ 100 sccm |
| | pressure: 0.5 Torr, RF power: 2 W, substrate temperature: 270° C., thickness: 100Å |
| MW-i layer | $SiH_4$ 40 sccm, $GeH_2$ 40 sccm, $SiH_2Cl_2$ 3 sccm, $H_2$ 150 sccm, $B_2H_6$ 1 ppm |
| | pressure: 7 mTorr, MW power: 220 W, RF bias power: 700 W substrate temperature: 380° C., thickness: 700Å |
| RF-i layer | $Si_2H_6$ 4 sccm, $H_2$ 100 sccm |
| | pressure: 0.5 Torr, RF power: 2 W, substrate temperature: 270° C., thickness: 200Å |
| p-type layer | $SiH_4$ (diluted 10% with $H_2$) 0.25 sccm, $H_2$ 34 sccm |
| | $B_2H_6$ (diluted 2% with $H_2$) 1 sccm |
| | pressure: 2 Torr, RF power: 42 W, substrate temperature: 200° C., thickness; 100Å |
| (top cell) | |
| n-type layer | $SiH_4$ 1 sccm, $H_2$ 48 sccm, $PH_2$ (diluted 1% with $H_2$) 1 sccm |
| | pressure: 1.3 Torr, RF power: 1.8 W, substrate temperature: 380° C., thickness: 100Å |
| RF-i layer | $Si_2H_6$ 4 sccm, $H_2$ 100 sccm |
| | pressure: 0.5 Torr, RF power: 2 W, substrate temperature: 250° C., thickness: 1000Å |
| p-type layer | $SiH_4$ (diluted 10% with $H_2$) 0.25 sccm, $H_2$ 34 sccm |
| | $B_2H_6$ (diluted 2% with $H_2$) 1 sccm |
| | pressure: 2 Torr, RF power: 42 W, substrate temperature: 260° C., thickness: 100Å |
| transparent electrode | $In_2O_3$, reactive vapor deposition method, 700Å |
| collecting electrode | Cr (1000 Å)/Ag (10000Å)/Cr (1000 Å) |

TABLE 14

| | |
|---|---|
| base member | stainless steel SUS430 (JIS standard), thickness: 0.125 mm |
| substrate | SUS430/AG 4500Å/ZnO 1 μm (texture structure) |
| (bottom cell) | |
| n-type layer | $SiH_4$ 1 sccm, $H_2$ 48 sccm, $PH_2$ (diluted 1% with $H_2$) 0.5 sccm |
| | pressure; 1.3 Torr, RF power; 1.8 W, substrate temperature: 380° C., thickness: 400Å |
| RF-i layer | $Si_2H_2$ 4 sccm, $H_2$ 100 sccm |
| | pressure: 0.5 Torr, RF power; 2 W, substrate temperature: 270° C., thickness: 100Å |
| MW-i layer | $SiH_4$ 40 sccm, $GeH_2$ 40 sccm, $SiH_2Cl_2$ 2 sccm, $H_2$ 150 sccm, $B_2H_6$ 0.6 ppm, $CH_2$ 1 sccm |
| | pressure: 7 mTorr, MW power: 220 W, RF bias power: 700 W substrate temperature: 380° C., thickness: 700Å |
| RF-i layer | $Si_2H_6$ 4 sccm, $H_2$ 100 sccm, $CH_2$ 0.4 sccm |
| | pressure: 0.5 Torr, RF power; 2 W, substrate temperature: 270° C., thickness: 200Å |
| p-type layer | $SiH_4$ (diluted 10% with $H_2$) 0.25 sccm, $H_2$ 34 sccm |
| | $B_2H_6$ (diluted 2% with $H_2$) 1 sccm |
| | pressure: 2 Torr, RF power: 42 W, substrate temperature: 200° C., thickness, 200Å |
| (middle cell) | |
| n-type layer | $SiH_4$ 1 sccm, $H_2$ 48 sccm, $PH_2$ (diluted 1%. with $H_2$) 1 sccm |
| | pressure; 1.3 Torr, RF power; 1.8 W, substrate temperature: 380° C., thickness: 100Å |
| RF-i layer | $Si_2H_6$ 4 sccm, $H_2$ 100 sccm |
| | pressure: 0.5 Torr, RF power: 2 W, substrate temperature: 270° C., thickness: 100Å |
| MW-i layer | $SiH_4$ 40 sccm, $GeH_2$ 40 sccm, $SiH_4 Cl_2$ 3 sccm, $H_2$ 150 sccm, $B_2H_6$ 1 ppm |

TABLE 14-continued

| | |
|---|---|
| | pressure: 7 mTorr, MW power: 220 W, RF bias power: 700 W substrate temperature: 380° C., thickness: 500Å |
| RF-i layer | $Si_2H_6$ 4 sccm, $H_2$ 100 sccm, $CH_4$ 0.4 sccm |
| | pressure: 0.5 Torr, RF power, 2 W, substrate temperature: 270° C., thickness: 200Å |
| p-type layer | $SiH_4$ (diluted 10% with $H_2$) 0.25 sccm, $H_2$ 34 sccm |
| | $B_2H_6$ (diluted 2% with $H_2$) 1 sccm |
| | pressure: 2 Torr, RF power: 42 W, substrate temperature: 200° C., thickness; 100Å |
| (top cell) | |
| n-type layer | $SiH_4$ 1 sccm, $H_2$ 48 sccm, $PH_2$ (diluted 1% with $H_2$) 1 sccm |
| | pressure: 1.3 Torr, RF power: 1.8 W, substrate temperature: 380° C., thickness: 100Å |
| RF-i layer | $Si_2H_6$ 4 sccm, $H_2$ 1 00 sccm |
| | presure: 0.5 Torr, RF power: 2 W, substrate temperature: 250° C., thickness: 1000Å |
| p-type layer | $SiH_4$ (diluted 10% with $H_2$) 0.25 sccm, $H_2$ 34 sccm |
| | $B_2H_6$ (diluted 2% with $H_2$) 1 sccm |
| | pressure: 2 Torr, RF power: 42 W, substrate temperature: 200° C.. thickness: 100Å |
| transparent electrode | $In_2O_3$, reactive vapor depositon method, 700Å |
| collecting electrode | Cr (1000 A)/Ag (10000Å)/Cr(1000Å) |

TABLE 15

| | |
|---|---|
| base member | stainless steel SUS430 (JIS standard), thickness: 0.125 mm |
| substrate | SUS430/AG 4500Å/ZnO 1 μm (texture structure) |
| (bottom cell) | |
| n-type layer | $SiH_4$ 10 sccm, $H_2$ 480 sccm, $PH_3$ (diluted 1% with $H_2$) 0.5 sccm |
| | pressure; 1.3 Torr, RF power, 18 W, substrate temperature: 380° C., thickness: 400Å |
| RF-i layer | $Si_2H_6$ 80 sccm, $H_2$ 500 sccm |
| | pressure: 0.5 Torr, RF power, 20 W, substrate temperature: 270° C., thickness: 100Å |
| MW-i layer | $SiH_4$ 160 sccm, $GeH_4$ 160 sccm, $SiH_4 Cl_2$ 8 sccm, $H_2$ 600 sccm, $B_2H_6$ 2.4 ppm, |
| | pressure: 7 mTorr, MW power: 440 W, RF bias power: 1000 W substrate temperature: 380° C., thickness: 700Å |
| RF-i layer | $SiH_4$ 80 sccm, $H_2$ 500 sccm |
| | pressure: 0.5 Torr, RF power: 20 W, substrate temperature: 270° C., thickness: 200Å |
| p-type layer | $SiH_4$ (diluted 10% with $H_2$) 2.5 sccm, $H_2$ 340 sccm |
| | $B_2H_6$ (diluted 2% with $H_2$) 10 sccm |
| | pressure: 2 Torr, RF power: 420 W, substrate temperature: 200° C., thickness; 200Å |
| (middle cell) | |
| n-type layer | $SiH_4$ 10 sccm, $H_2$ 480 sccm, $PH_2$ (diluted 1% with $H_2$) 10 sccm |
| | pressure; 1.3 Torr, RF power; 18 W, substrate temperature: 380° C., thickness: 100Å |
| RF-i layer | $SiH_4$ 80 sccm, $H_2$ 500 sccm |
| | pressure: 0.5 Torr, RF power: 20 W, substrate temperature: 270° C., thickness: 100Å |
| MW-i layer | $SiH_4$ 160 sccm, $GeH_4$ 160 sccm, $SiH_4 Cl_2$ 8 sccm, $H_2$ 600 sccm, $B_2H_6$ 2.4 ppm |
| | pressure: 7 mTorr, MW power: 440 W, RF bias power: 1000 W substrate temperature: 380° C., thickness: 500Å |
| RF-i layer | $SiH_4$ 80 sccm, H 500 sccm |
| | pressure: 0.5 Torr, RF power; 20 W, substrate temperature: 270° C., thickness. 200Å |
| p-type layer | $SiH_4$ (diluted 10% with $H_2$) 2.5 sccm, $H_2$ 340 sccm |
| | $B_2H_6$ (diluted 2% with $H_2$) 10 sccm |
| | pressure: 2 Torr, RF power. 420 W, substrate temperature: 200° C., thickness; 100Å |
| (top cell) | |
| n-type layer | $SiH_4$ 1 sccm, $H_2$ 48 sccm, $PH_3$ (diluted 1% with $H_2$) 1 sccm |
| | pressure: 1.3 Torr, RF power: 1.8 W, substrate temperature: 380° C., thickness: 100Å |
| RF-i layer | $SiH_4$ 40 sccm, $H_2$ 500 sccm |
| | pressurm: 0.5 Torr, RF power: 20 W, substrate temperature: 250° C., thickness: 1000Å |

TABLE 15-continued

| | |
|---|---|
| p-type layer | $SiH_4$ (diluted 10% with $H_2$) 2.5 sccm, $H_2$ 340 sccm<br>$B_2H_6$ (diluted 2% with $H_2$) 10 sccm<br>pressure: 2 Torr, RF power: 420 W, substrate temperature: 200° C., thickness: 100Å |
| transparent electrode | $In_2O_3$, reactive vapor deposition method, 700Å |
| collecting electrode | Ag paste |

What is claimed is:

1. A photovoltaic element comprising a substrate and a multi-layered semiconductor active layer having a pin junction structure disposed on said substrate, said multi-layered semiconductor layer comprising a non-single crystal semiconductor layer of n- or p-type, a non-single crystal i-type semiconductor layer and a non-single crystal semiconductor layer of p- or n-type being stacked in this order from the substrate side, characterized in that said i-type semiconductor layer comprises a three-layered structure comprising a non-single crystal layer (b) formed by means of a microwave plasma CVD process interposed between a pair of non-single crystal layers (a) and (c) each formed by means of a RF plasma CVD process, and said i-type layer (b) is a non-single crystal i-type layer formed by means of the microwave plasma process from a mixture comprising a silane series gas not containing chlorine atom(s), a chlorine-containing raw material gas in an amount of 10% or less of the total amount of the chlorine-free silane series gas and the chlorine-containing raw material gas, and hydrogen gas.

2. A photovoltaic element according to claim 1, wherein the chlorine-containing raw material gas is $SiH_2Cl_2$.

3. A photovoltaic element according to claim 1, wherein the i-type layer (b) contains an element belonging to group IIIA of the periodic table.

4. A photovoltaic element according to claim 3, wherein the element is selected from the group consisting of B, Al, Ga, In, and Tl.

5. A photovoltaic element according to claim 1, wherein the i-type layer (b) contains an element belonging to group VA of the periodic table.

6. A photovoltaic element according to claim 5, wherein the element is selected from the group consisting of P, AS, Sb, and Pb.

7. A photovoltaic element according to claim 1, wherein in the formation of the i-type layer (b), the amount of the chlorine-containing raw material gas is graded so as to decrease in the thickness direction toward the n-type semiconductor layer or the p-type semiconductor layer.

8. A photovoltaic element according to claim 1, wherein in the formation of the i-type layer (b), the amount of the chlorine-containing raw material gas is graded so as to decrease in the thickness direction toward the n-type semiconductor layer and also toward the p-type semiconductor layer.

9. A photovoltaic element according to claim 1, wherein the i-type layer (D) contains a band gap decreasing element.

10. A photovoltaic element according to claim 9, wherein the band gap decreasing element is selected from the group consisting of Ge and Sn.

11. A photovoltaic element according to claim 1, wherein the formation of the i-type layer (b) is conducted under a vacuum of 20 mTorr or less.

12. A photovoltaic element according to claim 1, wherein each of the i-type layers (a) and (c) is formed at a lower substrate temperature than that at which the i-type layer (b) is formed.

13. A photovoltaic element according to claim 1, wherein the i-type layer (b) contains one or more elements selected from the group consisting of C, O, and N.

14. A photovoltaic element according to claim 1, wherein the non-single crystal layer (b) contains silicon and germanium atoms.

15. A photovoltaic element comprising a substrate and a plurality of multi-layered semiconductor active layers each having a pin junction structure disposed on said substrate, each of said plurality of multi-layered semiconductor layers comprising a non-single crystal semiconductor layer of n- or p-type, a non-single crystal i-type semiconductor layer and a non-single crystal semiconductor layer of p- or n-type being stacked in this order from the substrate side, characterized in that each said i-type semiconductor layer comprises a three-layered structure comprising a non-single crystal layer (b) formed by means of a microwave plasma CVD process interposed between a pair of non-single crystal layers (a) and (c) each formed by means of a RF plasma CVD process, and each said i-type layer (b) is a non-single crystal i-type layer formed by means of the microwave plasma process from a mixture comprising a silane series gas not containing chlorine atom(s), a chlorine-containing raw material gas in an amount of 10% of the total amount of the chlorine-free silane series gas and the chlorine-containing raw material gas, and hydrogen gas.

16. A photovoltaic element according to claim 14, wherein the non-single crystal layer (b) contains silicon and germanium atoms.

* * * * *

UNITED STATES PATENT AND TRADEMARK OFFICE
CERTIFICATE OF CORRECTION

PATENT NO. : 5,676,765

DATED : October 14, 1997

INVENTOR(S): KEISHI SAITO ET AL.

It is certified that error appears in the above-identified patent and that said Letters Patent is hereby corrected as shown below:

ON THE TITLE PAGE AT [56] REFERENCES CITED, OTHER PUBLICATIONS

"Amophous" should read --Amorphous--.

COLUMN 10

Line 56, "atom," should read --atoms(s),--.

COLUMN 13

Line 67, "ÅA/sec." should read --Å/sec.--.

COLUMN 14

Line 2, "0.02 W/cm$^3$" should read --0.2 W/cm$^3$--;
Line 58, "j unction" should read --junction--.

COLUMN 16

Line 44, "Cr" (second occurrence) should read --Cu--.

COLUMN 20

Line 44, "substrate," should read --substrate.--.

COLUMN 21

Line 17, "Mw" should read --MW--.

UNITED STATES PATENT AND TRADEMARK OFFICE
CERTIFICATE OF CORRECTION

PATENT NO. : 5,676,765

DATED : October 14, 1997

INVENTOR(S): KEISHI SAITO ET AL.

It is certified that error appears in the above-identified patent and that said Letters Patent is hereby corrected as shown below:

COLUMN 26

Line 38, "$1 \times 10^{316}$" should read -- $1 \times 10^{-6}$ --.

COLUMN 31

Line 41, "B." should read --B,--.

COLUMN 33, TABLE 1

In the "base member" entry "standardl" should read --standard);
In the "RF-i layer entry (second occurrence) "$Si_2H$," should read --$Si_2H_6$--; and "6.5" should read --0.5--.

COLUMN 34, TABLE 3

In No. 1-5, under the column titled "density of state", "O.BG" should read --0.80--.

COLUMN 35, TABLE 5

In the row titled "No.", "2.8" should read --2-8--.

UNITED STATES PATENT AND TRADEMARK OFFICE
CERTIFICATE OF CORRECTION

PATENT NO. : 5,676,765

DATED : October 14, 1997

INVENTOR(S): KEISHI SAITO ET AL.

It is certified that error appears in the above-identified patent and that said Letters Patent is hereby corrected as shown below:

COLUMN 35, TABLE 6

In No. 2-6, under the column titled "density of state", "0.8 1" should read --0.81--;
In the column titled "No.", "2.8" should read --2-8--.

COLUMN 35, TABLE 8

In No. 3-2, under the column titled "density of state", "0,88" should read --0.88-- and should be centered.

COLUMN 36, TABLE 8-CONTINUED

In No. 3-14, under column titled "environmental resistance", "U.76" should read --0.76--.

COLUMN 37, TABLE 11

In the entry for "MW-i layer", "power" (second occurrence) should read --power:--.

COLUMN 37, TABLE 12

In the entry for "RF-i layer" (second occurrence) "temperature. 270°" should read --temperature: 270°--.

COLUMN 37, TABLE 13

In the entry for "n-type layer" "ditutad" should read --diluted--.

UNITED STATES PATENT AND TRADEMARK OFFICE
CERTIFICATE OF CORRECTION

PATENT NO. : 5,676,765

DATED : October 14, 1997

INVENTOR(S): KEISHI SAITO ET AL.

It is certified that error appears in the above-identified patent and that said Letters Patent is hereby corrected as shown below:

COLUMN 39, TABLE 14

In entry for n-type layer (first occurrence), "$PH_2$" should read --$PH_3$--;
In entry for RF-i layer (first occurrence), "$Si_2H_2$" should read --$Si_2H_6$--;
In entry for MW-i layer (first occurrence), "$GeH_2$" should read --$GeH_4$--; and "$CH_2$" should read --$CH_4$--;
In entry for RF-i layer (second occurrence), "$CH_2$" should read --$CH_4$--;
In entry for n-type layer (second occurrence), "$PH_2$" should read --$PH_3$--.
In entry for MW-i layer (second occurrence), "$SiH_4\ Cl_2$" should read --$SiH_2Cl_2$--.

COLUMN 41, TABLE 14-CONTINUED

In entry for n-type layer, "$PH_2$" should read --$PH_3$--.

COLUMN 41, TABLE 15

In entry for MW-i layer (first occurrence), "$SiH_4\ Cl_2$" should read --$SiH_4Cl_2$--;
In entry for MW-i layer (second occurrence), "$SiH_4\ Cl_2$" should read --$SiH_4Cl_2$--;
In entry for RF-i layer (fourth occurrence), "H" should read --$H_2$--.

UNITED STATES PATENT AND TRADEMARK OFFICE
CERTIFICATE OF CORRECTION

PATENT NO. : 5,676,765

DATED : October 14, 1997

INVENTOR(S): KEISHI SAITO ET AL.

It is certified that error appears in the above-identified patent and that said Letters Patent is hereby corrected as shown below:

COLUMN 43

Line 42, "AS" should read --As--.

COLUMN 44

Line 12, "(D)" should read --(b)--.

Line 50, "claim 14," should read --claim 15,--.

Signed and Sealed this

Twenty-fourth Day of November, 1998

Attest:

BRUCE LEHMAN

Attesting Officer

Commissioner of Patents and Trademarks